(12) United States Patent
Zanarini et al.

(10) Patent No.: US 11,748,547 B2
(45) Date of Patent: Sep. 5, 2023

(54) METHOD OF DETERMINING A THREE-DIMENSIONAL LAYOUT OF ELECTRICAL CONNECTIONS OF AN ELECTRIC COMPONENT

(71) Applicant: Hitachi Energy Switzerland AG, Baden (CH)

(72) Inventors: Alessandro Zanarini, Baden (CH); Jan Poland, Nussbaumen (CH); Philippe Stefanutti, Choisy (FR); Harry Zueger, Chatelain/Genève (CH); Thomas Hertwig, Arnstadt (DE); Raphael Kegelin, Cruseilles (FR); Ming Zhang, Bad Honnef (DE)

(73) Assignee: HITACHI ENERGY SWITZERLAND AG, Baden (CH)

( * ) Notice: Subject to any disclaimer, the term of this patent is extended or adjusted under 35 U.S.C. 154(b) by 192 days.

(21) Appl. No.: 17/311,785

(22) PCT Filed: Dec. 9, 2019

(86) PCT No.: PCT/EP2019/084289
§ 371 (c)(1),
(2) Date: Jun. 8, 2021

(87) PCT Pub. No.: WO2020/120419
PCT Pub. Date: Jun. 18, 2020

(65) Prior Publication Data
US 2022/0035985 A1 Feb. 3, 2022

(30) Foreign Application Priority Data

Dec. 10, 2018 (EP) ..................... 18211448

(51) Int. Cl.
*G06F 30/392* (2020.01)
*G06F 30/394* (2020.01)
*G06F 30/398* (2020.01)

(52) U.S. Cl.
CPC .......... *G06F 30/394* (2020.01); *G06F 30/392* (2020.01); *G06F 30/398* (2020.01)

(58) Field of Classification Search
CPC .. G06F 30/20; G06F 2113/14; G06F 2113/16; G06F 3/0484; G06F 30/12;
(Continued)

(56) References Cited

U.S. PATENT DOCUMENTS 8,418,115 B1 4/2013 Tom et al.
8,473,881 B1 6/2013 Fang et al.
(Continued)

FOREIGN PATENT DOCUMENTS

CN 1963827 A 5/2007
CN 101667212 A 3/2010
(Continued)

OTHER PUBLICATIONS

Chinese First Office Action dated May 12, 2022 for Chinese Patent Application No. 201980072352.9, 19 pages (including English translation).
(Continued)

*Primary Examiner* — Binh C Tat
(74) *Attorney, Agent, or Firm* — Sage Patent Group

(57) ABSTRACT

To determine a three-dimensional layout of electrical connections of an electric component, a processor executes a path optimization routine to determine three-dimensional routes for a plurality of electrical connections of the electric component. A conflict management is performed to generate conflict-free three-dimensional routes for the plurality of electrical connections.

20 Claims, 16 Drawing Sheets

(58) Field of Classification Search
CPC .......... G06F 30/13; G06F 30/18; G06F 30/27;
G06F 30/39; G06F 30/398; G06F 30/367;
G06F 30/394; G06F 30/392; G06F 16/22;
G06F 2119/12; G06F 30/327; G06F
1/163; G06F 17/16; G06F 18/23; G06F
18/231; G06F 18/2431; G06F 2111/02;
G06F 2111/04; G06F 2111/06; G06F
2111/12; G06F 2113/18; G06F 2113/20;
G06F 2117/10; G06F 3/012; G06F 3/013;
G06F 3/015; G06F 30/30; G06F 30/33;
G06F 30/3312; G06F 30/337; G06F
30/347; G06F 30/36; G06F 30/3947;
G06F 30/3953; G06F 30/396; G06F
9/30036; G06F 9/30043; G06F 9/3851;
G06F 9/3893; G06F 2111/10; G06F
30/00; G06F 30/17; G06F 18/22; G06F
2115/06; G06F 2119/10; G06F 30/15;
G06F 1/1658; G06F 16/90335; G06F
18/214; G06F 21/606; G06F 2119/06;
G06F 3/017; H01L 2224/48227; H01L
2224/16225; H01L 2225/0651; H01L
2225/06527; H01L 2924/13091; H01L
25/50; H01L 23/49838; H01L 23/5225;
H01L 24/25; H01L 23/485; H01L
27/0922; H01L 29/0653
USPC .................................................. 716/110–116
See application file for complete search history.

(56) References Cited

U.S. PATENT DOCUMENTS

| | | | |
|---|---|---|---|
| 9,337,146 B1* | 5/2016 | Yi | ........................... H01L 24/82 |
| 9,507,908 B2 | 11/2016 | Hadley et al. | |
| 9,589,079 B2 | 3/2017 | Morse et al. | |
| 9,613,173 B1 | 4/2017 | Aggarwal et al. | |
| 2008/0082944 A1 | 4/2008 | Yamaguchi et al. | |
| 2012/0110536 A1* | 5/2012 | Agarwal | ............... G06F 30/394 |
| | | | 716/129 |
| 2016/0019946 A1* | 1/2016 | Lin | ..................... H01L 23/5226 |
| | | | 438/109 |

FOREIGN PATENT DOCUMENTS

| | | |
|---|---|---|
| CN | 102930092 A | 2/2013 |
| CN | 103493053 A | 1/2014 |
| CN | 104809309 A | 7/2015 |
| CN | 106294929 A | 1/2017 |
| CN | 107408137 A | 11/2017 |
| CN | 108140067 A | 6/2018 |
| CN | 108268733 A | 7/2018 |

OTHER PUBLICATIONS

Cheng et al., "3D Cabling Design of a Turntable of a Vehicle-borne Radar," Electro-Mechanical Engineering, Issue 04, Aug. 15, 2017, 4 pages (including English abstract).

Su et al., "Recommendations for applying 3D electrical wiring in system electrical and wiring design," Electrician Abstract, Issue 03, Jun. 20, 2013, 5 pages (including English abstract).

Cai et al., "Research on 3D Collaborative Design of Aircraft Cable Based on Creo," Journal of Projectiles, Rockets, Missiles and Guidance, Issue 06, Dec. 15, 2016, 4 pages (including English abstract).

Chuanhai, "Research on Key Technology of 3D Cable Wiring based on CREO," China Doctoral Dissertations/Masters' Theses Full-text Database (Master) Engineering Technology Edition II, Issue 03, Mar. 15, 2017, 85 pages (including English Abstract.

Jang, "A study on three dimensional layout design by the simulated annealing method," Abstract only, Journal of Mechanical Science and Technology, 22, Jan. 23, 2009, 1 page.

International Search Report and Written Opinion of the International Searching Authority, PCT/EP2019/084289, dated Mar. 11, 2020, 13 pages.

Cong, Jason et al., "Multiway VLSI Circuit Partitioning Based on Dual Net Representation", IEEE Transactions on Computer Aided Design of Integrated Circuits and Systems, vol. 15, No. 4, Apr. 1996, 14 pages.

Guirardello, Reginaldo et al., "Optimization of process plant layout with pipe routing", Computers and Chemical Engineering, vol. 30, 2005, pp. 99-114.

Extended European Search Report dated Jul. 30, 2019 for European Patent Application No. 18211448.8, 7 pages.

Eilam, Tzoreff, Tali, "The disjoint shortest paths problem," Discrete Applied Mathematics, 85 (1998), pp. 113-138.

Guruswami, Venkatesan et al., "Near-Optimal Hardness Results and Approximation Algorithms for Edge-Disjoint Paths and Related Problems," Journal of Computer and System Sciences, 67 (2003) pp. 473-496.

Yadollahi, Milad et al, "Power transformer optimal design using an innovative heuristic algorithm combined with mixed-integer non-linear programming and FEM technique," IET Generation, Transmission & Distribution, 2017, vol. 11, Iss. 13, pp. 3359-3370.

* cited by examiner

METHOD OF DETERMINING A THREE-DIMENSIONAL LAYOUT OF ELECTRICAL CONNECTIONS OF AN ELECTRIC COMPONENT

CROSS REFERENCE TO RELATED APPLICATIONS

This application is a 35 U.S.C. § 371 national stage application of PCT International Application No. PCT/EP2019/084289 filed on Dec. 9, 2019, which in turns claims foreign priority to European Patent Application No. 18211448.8, filed on Dec. 10, 2018, the disclosures and content of which are incorporated by reference herein in their entirety.

FIELD OF THE INVENTION

The invention relates to methods of determining a layout of an electric component. The invention relates in particular to methods and systems for determining a three-dimensional layout of internal electrical connections of an electric component, such as a transformer, a power converter, an inductor, a capacitor, a battery, a circuit breaker, a power resistor, a transducer, or another power network component.

BACKGROUND OF THE INVENTION

The design of power transformers, power converters, circuit breakers, and other power network components is a demanding and complex task. The design process takes place according to design rules that need to take into account the boundary conditions and constraints for the respective use case.

Due to variations in boundary conditions and constraints, the design of every new power transformers, power converter, circuit breaker, or other power network component is similar to the construction of a new prototype. The three-dimensional routing for electrical connections, such as wires or bus bars, and the three-dimensional layout of the supporting framework may vary from one electric component to another.

A conventional process is performed in a manner similar to the actual manufacturing process in a workshop. At first, a framework and a connection to a press beam is constructed by a human engineer. Lead supports are positioned on ribs of the framework. The lead supports represent intermediate points between the start and end points of a lead. Depending on the positioning of the lead supports, the leads routing is then implemented by a human engineer. The design process is an iterative design process that is influenced by trial and error, starting from the framework and the resultant lead routing, which is iteratively repeated until a suitable solution is found.

The internal lead connection design of a transformer, converter, circuit breaker, or other power network component is a complex problem. There can be significant variations in the numbers and arrangements of connection points (e.g., winding exit, bushing, tap changer, current transformer and surge arrestors), which can be freely distributed in the transformer or other power network component and which define the routing optimization process in three-dimensional search space.

Routing should also take into account various constraints, including electrical, mechanical, and thermal constraints, which makes the design task even more challenging.

Reginaldo Guirardello and Ross E. Swaney, "Optimization of process plant layout with pipe routing", Computers and Chemical Engineering 30 (2005) 99-114 discloses a design process of chemical plant geometric layout, in which the task is decomposed in a sequence of subproblems. The specifics and requirements of chemical plant layout and internal connections of an electric component differ significantly. Routing electrical connections in a power transformer or other electric power component has constraints which make the application of methods developed for pipe routing impossible.

CN 1 963 827 A1 discloses computer aided design methods developed for the automation of analog circuit layout design, in particular for Very Large Scale Integration (VLSI) design. The specifics and requirements of VLSI design automation differ significantly from the lead routing in transformers or other electric power network components. For illustration, in VLSI design, the routing is not in three dimensions, but takes place on multiple layers, which allows the task to be decomposed into many two-dimensional optimization problems.

U.S. Pat. Nos. 8,473,881 B1 and 8,418,115 B1 disclose methods for designing integrated semiconductor circuits.

There is a continued need in the art for improved methods and systems for determining a layout of an electric component. There is a continued need in the art for improved methods and systems for determining a three-dimensional layout of electrical connections of an electric component, such as a transformer, a power converter, an inductor, a capacitor, a battery, a circuit breaker, a power resistors, a transducer, or another power network component.

SUMMARY

It is an object of the invention to provide an improved methods and systems for determining a layout of internal electrical connections of an electric component in three dimensions, when the routing of the internal electrical connections is not limited to a set of two-dimensional planes. It is in particular an object to provide automatic methods and systems that do not require a user to specify the geometry of a support framework for the internal connections, but which can determine the three-dimensional routing of the internal electrical connections without requiring prior user-specified information on the support framework layout.

A method, a computer-readable instruction code, and a system as recited in the independent claims are provided. The dependent claims define embodiments.

The invention provides techniques for the three dimensional design of electrically connecting parts and, if desired, of supports of an electric component, using an optimum route search in three dimensions and conflict management. The optimum route search and/or conflict management may use heuristics.

Embodiments of the invention address the need to determine electrically conducting connections between points placed in a free volume. The techniques can balance different objectives, including the targets of (i) reducing costs associated with the electrically conducting connections and (ii) operational feasibility of the electrically conducting connections that could be considered as global cost of the layout.

The techniques disclosed herein can be used in various contexts where it is desired to provide connections between points, using cost optimization.

One field in which the disclosed methods and systems can be used is the routing of electrical connections for transformers for the mechanical design process of transformers (e.g. power transformer, traction transformer) and their influence on a size of the transformer tank.

The disclosed methods and systems allow the mechanical design process to be simplified with the aid of a computer.

The disclosed methods and systems also allow development time and costs associated with a new project to be reduced.

The disclosed techniques are not limited to the field of transformer design, but may be applied to a wide variety of different technical fields, including the design of other power network components, without being limited thereto.

According to the invention, a method of determining a three-dimensional layout of electrical connections of an electric component, in particular of a power network component, is provided. The method comprises the following steps that are automatically performed by at least one processor: executing a path optimization routine to determine three-dimensional routes for a plurality of electrical connections of the electric component; performing a conflict management for the three-dimensional routes to generate conflict-free three-dimensional routes for the plurality of electrical connections; and determining the three-dimensional layout of the electrical connections of the electric component based on the conflict-free three-dimensional routes.

Contrary to conventional human-based approaches to determining the three-dimensional layout of electrical connections, the method to the invention starts from determining the three-dimensional routes for a plurality of electrical connections, without requiring information on the supporting framework.

Contrary to conventional techniques for, e.g., integrated semiconductor circuit the sign, the routing is truly three-dimensional in the sense that the routes to not need to extend in sets of parallel planes.

The path optimization routine and/or the conflict management may use a heuristic. The heuristic may guide an optimum path search, e.g., to speed up the optimum path search.

The path optimization routine and/or the conflict management may take into account thermal constraints.

The method may comprise converting thermal constraints into first geometric constraints that are taken into consideration when determining the three-dimensional routes or when performing conflict management.

Determining the first geometric constraints may comprise performing thermal modeling. The thermal modeling may depend on, e.g., the type of electric component, such as power transformer or circuit breaker, the type and thermal characteristics of the insulation that will be used, and/or other information that may be user-specified.

The path optimization routine and/or the conflict management may take into account mechanical constraints.

The method may comprise converting mechanical constraints into second geometric constraints that are taken into consideration when determining the three-dimensional routes or when performing conflict management.

Taking into account mechanical constraints may comprise performing modeling of mechanical characteristics, such as stresses or strains on electrical connections.

The path optimization routine and/or the conflict management may take into account electrical constraints.

The method may comprise converting electrical constraints into third geometric constraints that are taken into consideration when determining the three-dimensional routes or when performing conflict management.

Taking into account electrical constraints may comprise performing modeling of electrical characteristics, such as cross-induction or cross-capacitance.

The method may be configured such that a group of two or more of the electrical connections may be routed jointly along at least part of the length of the two or more of the electrical connections. For that purpose, the group of the electrical connections or portions of the electrical connections of the group may be transformed into a virtual connection that is routed as if it were a single physical connection. Once routing is completed and/or during conflict management, the single virtual connection may be resolved back into a group of two or more separate, distinct electrical connections.

The method may comprise defining a virtual connection that represents a group of at least two of the plurality of electrical connections or of at least two of the plurality of electrical connections. The path optimization routine and, optionally, conflict management may be performed for the virtual connection to ensure that the group is kept together when routed in the electric component.

The method may comprise dividing up at least two of the plurality of electrical connections into a jointly-routed portion that is to be routed jointly with the portions of other electrical connections and a further portion that does not need to be routed jointly with the portions of other electrical connections. The jointly-routed portions form the virtual connection.

The virtual connection and the further portions that do not need to be routed jointly may be processed sequentially in the path optimization routine and/or the conflict resolution.

The virtual connection and the further portions that do not need to be routed jointly may be processed at the same time.

The virtual connection may represent only portions of the at least two of the plurality of electrical connections. The at least two of the plurality of electrical connections may further comprise separate end portions. The virtual connection and the separate end portions may be routed separately.

The method may comprise approximating a position of the virtual terminals of the virtual connection. The virtual terminals may respectively be determined as an average, e.g., as a center of gravity of the terminals of the jointly routed portions of the electrical connections grouped together in the virtual connection. The virtual terminals may be distinct from the terminals of all constituent electrical connections grouped together in the virtual connection.

The method may comprise performing the path optimization routine and/or conflict management with relaxed constraints in a neighborhood of the virtual terminals. In the neighborhood of the virtual terminal(s), the determined route of the virtual connection may violate constraints, and the virtual connection may even penetrate a solid object in the neighborhood of the virtual terminal(s).

The optimization routine and conflict management may first be performed for connections that include at least one virtual connection. Subsequently, routing and conflict management are performed for end portions of the at least two electrical connections grouped together in the at least one virtual connection.

The jointly-routed portions of electrical connections that are combined into a virtual connection and the end portions of these electrical connections not included in the virtual connection may be routed sequentially, e.g., by sequentially performing the path optimization routines first for the jointly-routed portions of electrical connections and subsequently for the end portions.

The method may comprise determining whether a virtual connection is to be defined. The determining step may, but does not need to be explicit. The determining step may be performed based on a user input which defines a group of electrical connections that are to be routed jointly along a portion of their lengths.

A virtual connection can be defined in response to the user input. Co-routing of two or more electrical connections can be continued if at least two of the plurality of electrical connections extend in the same direction or substantially the same direction at a location at which the at least two of the plurality of electrical connections are proximate to each other.

A virtual connection can be defined in response to the user input. Co-routing of two or more electrical connections can be continued if at least two of the plurality of electrical connections extend in the same direction or substantially the same direction at a location at which a distance between at least two of the plurality of electrical connections is less than a distance threshold. The distance threshold may be predefined or may depend on characteristic dimensions of the electric component, e.g., the characteristic dimensions of a transformer tank. The distance threshold may depend on constraints imposed by the path optimization problem.

The path optimization routine may be executed so as to minimize an objective function. The objective function may comprise a term that encourages two or more of the electrical connections to be routed jointly along at least part of their lengths.

The path optimization routine may use a heuristic that guides an optimum path search. The heuristic may encourage two or more of the electrical connections to be routed jointly along at least part of their lengths.

Several hierarchies of groups or bundles may be defined. For illustration, several first hierarchy level virtual connections may be defined, each of which represents portions of at least two electrical connections.

One or several second hierarchy level virtual connections may be defined, each of which represents portions of at least two first hierarchy level virtual connections. The second hierarchy level here represents a higher hierarchy of the bundling concept. All techniques described above may be applied when routing second hierarchy level virtual connections that represent portions of at least two first hierarchy level virtual connections.

Grouping of individual electrical connections to a bundle may thereby be implemented hierarchically.

Grouping may be attained by approximating virtual terminals of the second hierarchy level virtual lead, e.g., as an average (e.g., a center of gravity) of first hierarchy level virtual leads that are to be bundled. Grouping may be attained by using an objective function in the path optimization routine which encourages groups of first hierarchy level virtual leads to be routed together. Grouping may be attained by using a heuristic in the path optimization routine which encourages groups of first hierarchy level virtual leads to be routed together. Grouping may alternative or additionally be attained by letting several first hierarchy level virtual leads extend in the same or substantially the same direction at a location at which they are proximate to each other.

Performing the conflict management may comprise executing the path optimization routine so that that the three-dimensional routes are conflict-free, but not necessarily optimum routes, and relaxing one or several of the three-dimensional routes when performing a path exploration to move from conflict-free first three-dimensional routes to conflict-free second three-dimensional routes.

This allows the conflict management to be performed by moving from feasible sub-optimal to feasible (close-to) optimal solutions. Each new route takes into account the previously planned electrical connections. For each added connection, the solution is feasible by construction. In a second step, once routing has been performed for all electrical connections, some electrical connections may be relaxed to find a better solution.

The conflict-free second three-dimensional routes reduce a value of an objective function when compared to the conflict-free first three-dimensional routes.

The path optimization routine may be performed independently for the plurality of electrical connections. The conflict management may comprise a conflict resolution in which cost penalties are computationally imposed for conflicting three-dimensional routes to ensure convergence towards conflict-free three-dimensional routes.

This allows the conflict management to be performed by moving from infeasible super-optimal to feasible optimal or close-to optimal solutions. Routes are planned independently from one another at first, creating conflicting routes of the electrical connections. In a second step, penalties are added in the conflicting parts in order to ensure convergence to a conflict-free solution.

The path optimization routine may comprise an optimum path search routine.

The path optimization routine may comprise an A* or Dijkstra algorithm.

The path optimization routine may comprise a bi-directional optimum path search routine. The bi-directional optimum path search routine may be one that starts expansion from opposing ends of the path.

The path optimization routine may comprise dynamic programming or mathematical programming.

The path optimization routine may comprise an exploration step. Such an exploration step is present in many path search routines, such as A* or Dijkstra algorithms. The exploration step may take into account electrical, thermal, and mechanical constraints. More particularly, the exploration step may find an optimum continuation of an already started route, wherein an expansion step is determined to be the optimum expansion step based on an objective function that includes objective function terms reflecting electrical, thermal, and mechanical constraints.

In a bi-directional path search routine, expansion may start from both ends of the path.

The path optimization routine may be performed on at least one grid. The at least one grid may be a hierarchical gridding.

The at least one grid may be spatially homogeneous.

The at least one grid may be spatially in homogeneous.

The method may further comprise processing the determined three-dimensional layout of the electrical connections to generate control commands for manufacturing equipment used to manufacture the electrical connections, such as cables or bus bars.

The manufacturing equipment may comprise a forming tool. The manufacturing equipment may comprise a bending tool, in particular a CNC-bending-tool. The manufacturing equipment may comprise another CNC-tool.

The method may further comprise automatically determining a three-dimensional layout of framework structures for the plurality of electrical connections based on the conflict-free three-dimensional routes.

The method may further comprise processing the determined three-dimensional layout of the framework structures to generate further control commands for further manufacturing equipment used to manufacture the framework structures.

The further manufacturing equipment may comprise a rapid prototyping machine.

The electric component for which the three-dimensional layout of internal electrical connections is determined may be a transformer, in particular a power transformer for a high or medium voltage power transmission network or for a high or medium voltage power generator.

The electric component for which the three-dimensional layout of internal electrical connections is determined may be a power converter, in particular a power converter for a high or medium voltage power transmission network or for a high or medium voltage power generator.

The electric component for which the three-dimensional layout of internal electrical connections is determined may be a semi-conductor.

The electric component for which the three-dimensional layout of internal electrical connections is determined may be an inductor, in particular an inductor for a high or medium voltage power transmission network or for a high or medium voltage power generator.

The electric component for which the three-dimensional layout of internal electrical connections is determined may be a capacitor, in particular a capacitor for a high or medium voltage power transmission network or for a high or medium voltage power generator.

The electric component for which the three-dimensional layout of internal electrical connections is determined may be a circuit breaker, in particular a circuit breaker for a high or medium voltage power transmission network or for a high or medium voltage power generator.

The electric component for which the three-dimensional layout of internal electrical connections is determined may be a power resistor, in particular a power resistor for a high or medium voltage power transmission network or for a high or medium voltage power generator.

The electric component for which the three-dimensional layout of internal electrical connections is determined may be a transducer, in particular a transducer for a high or medium voltage power transmission network or for a high or medium voltage power generator.

The method may be executed by a local computer, by a server, which may reside in the cloud, or as a distributed method on both the client and the server.

A method of manufacturing an electric component according to an embodiment may comprise determining the three-dimensional layout of the electric component using the method according to an embodiment, and automatically controlling a manufacturing equipment based on the determined three-dimensional layout.

The manufacturing equipment may comprise or may be a forming tool, such as a bending tool. The manufacturing equipment may comprise of may be a CNC-tool.

The method may further comprise automatically controlling a further manufacturing equipment based on the determined three-dimensional layout to generate a support framework or parts of a support framework for the electrical connections of the electric component.

The further manufacturing equipment may be or may comprise a rapid prototyping machine.

A computer-readable instruction code according to an embodiment comprises instructions which, when executed by at least one processor of a computing device, cause the processor to perform the method according to an embodiment.

A tangible computer-readable storage medium according to an embodiment has stored thereon instructions which, when executed by at least one processor of a computing device, cause the processor to perform the method according to an embodiment.

A system for determining a three-dimensional layout of electrical connections of an electric component, in particular of a power network component, is provided. The system comprises at least one integrated semiconductor circuit that is adapted to perform the following steps: executing a path optimization routine to determine three-dimensional routes for a plurality of electrical connections of the power network component; performing a conflict management for the three-dimensional routes to generate conflict-free three-dimensional routes for the plurality of electrical connections; and determining the three-dimensional layout of the electrical connections of the electric component based on the conflict-free three-dimensional routes.

The at least one integrated semiconductor circuit may comprise a processor, a controller, an application specific integrated circuit (ASIC) or a combination thereof.

The system may comprise memory storing instruction code which, when executed by the processor, causes the processor to perform the method of an embodiment.

The system may comprise a manufacturing equipment for shaping electrical connections. The system may be adapted such that the manufacturing equipment is controlled based on the determined three-dimensional layout. The manufacturing equipment may be controlled to bend or otherwise form electrical conductors into a desired shape for installation in the electric component.

The system may comprise a manufacturing equipment for manufacturing parts of a support framework or the entire support framework for the electrical connections. The system may be adapted such that the further manufacturing equipment is controlled based on the determined three-dimensional layout of the electrical connections. The further manufacturing equipment may be controlled to form parts or all of the support framework using, e.g., rapid prototyping.

Various effects and advantages are attained by the methods and systems according to the invention. For illustration, the methods and systems facilitate the determination of a layout of internal electrical connections of an electric component in three dimensions, when the routing of the internal electrical connections is not limited to a set of two-dimensional planes. The methods and systems do not require a user to specify the geometry of a support framework for the internal connections, but can determine the three-dimensional routing of the internal electrical connections without requiring prior user-specified information on the support framework layout.

The techniques disclosed herein can be applied to various power network components, such as a transformer, a power converter, a semi-conductor, an inductor, a capacitor, a battery, a circuit breaker, a power resistors, a transducer, without being limited thereto.

BRIEF DESCRIPTION OF THE DRAWINGS

The subject-matter of the invention will be explained in more detail with reference to preferred exemplary embodiments which are illustrated in the attached drawings, in which.

DETAILED DESCRIPTION OF EMBODIMENTS

Exemplary embodiments of the invention will be described with reference to the drawings in which identical or similar reference signs designate identical or similar elements. While some embodiments will be described in the context of specific exemplary electric components, such as power transformers, the embodiments are not limited thereto.

While some embodiments will be described in the context of specific exemplary route search or conflict management procedures, such as the A* or Dijkstra algorithm, the embodiments are not disclosed to these specific exemplary procedures.

The features of embodiments may be combined with each other, unless specifically noted otherwise.

In any one of the disclosed embodiments, the electrical connections may be selected from a group comprising busbars and round electrical connections, such as cables, without being limited thereto.

Figure 1:
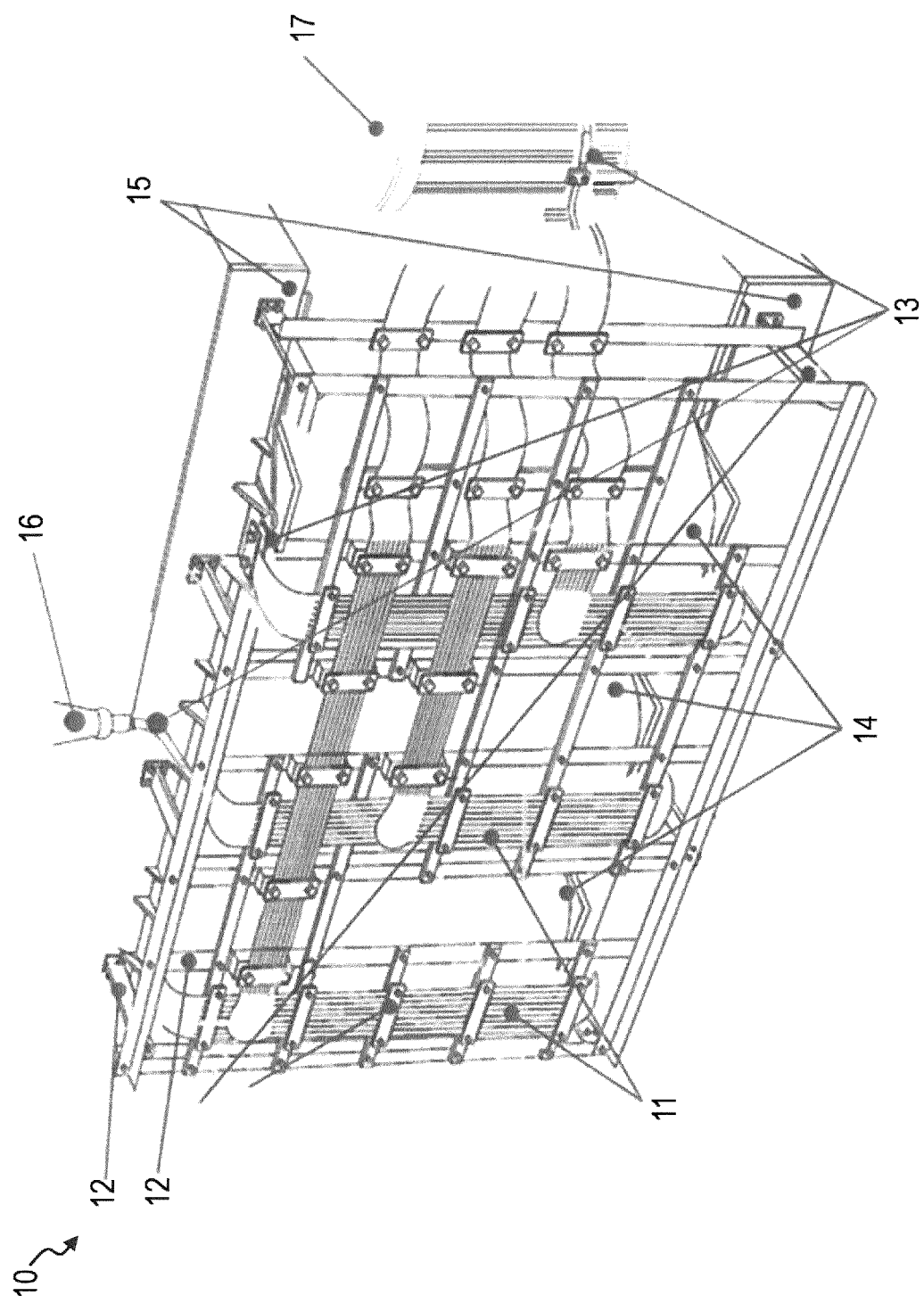
FIG. 1 is a schematic representation of a transformer layout to which the methods according to the invention may be applied.
Figure 2:
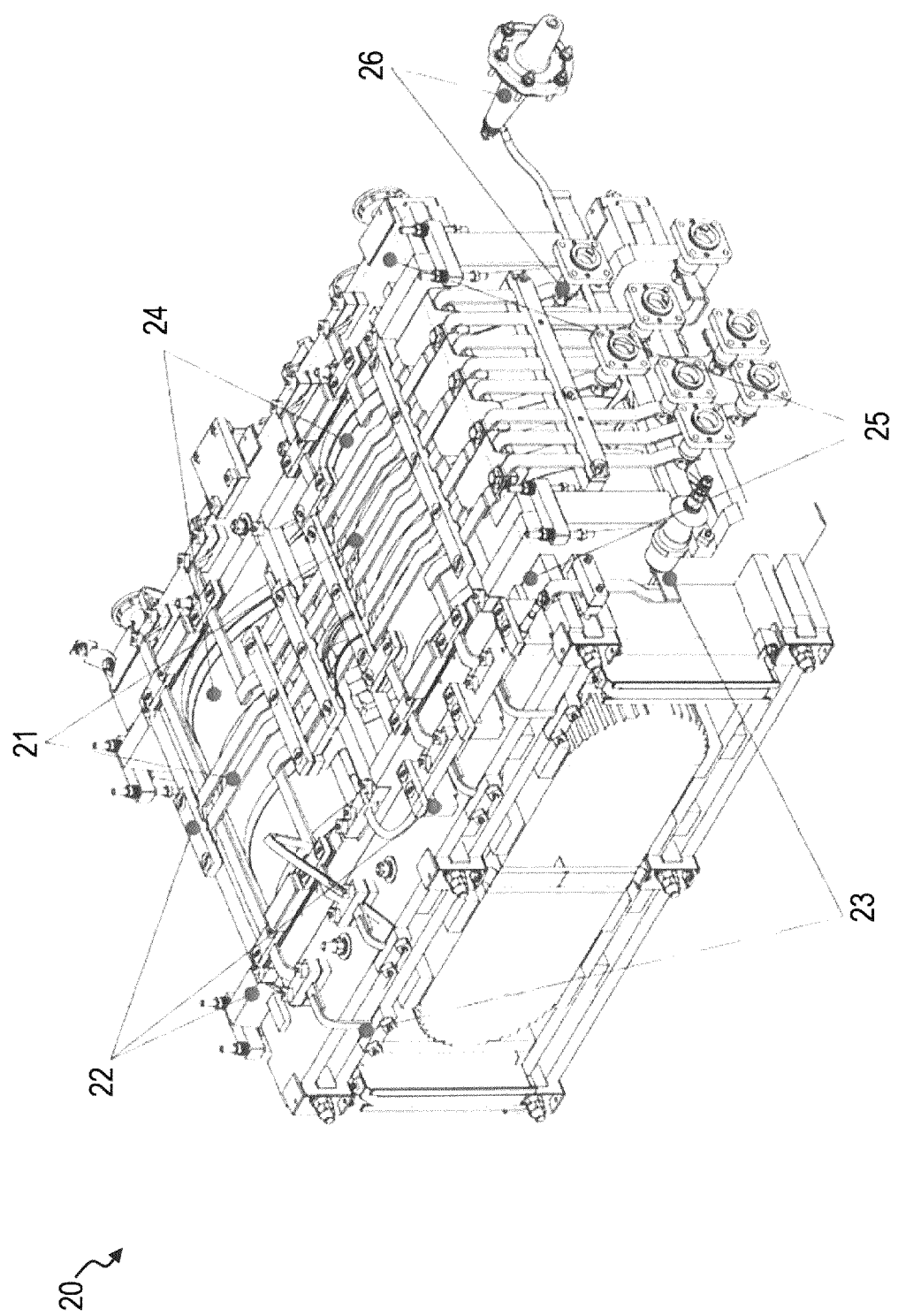
FIG. 2 is a schematic representation of a transformer layout to which the methods according to the invention may be applied.

FIGS. 1 and 2 illustrate exemplary layouts of transformers 10, 20, to which the techniques of the present application may be applied. The transformers 10, 20 respectively have the following components:

Electrical connections in the form of leads 11, 21: The electrical connections may be round (cable, tube, rod) or rectangular (bulbar).

Cleats 12, 22: The cleats may comprise a framework consisting of ribs, brackets, consoles and leads supports.

Contacts: The contacts may include winding-exits 23, connectors on bushings 16, 23, 26, connectors on tap-changers 17. The contacts may define start and end points for the internal electrical connections 11, 21.

Environment: Fixed components such as walls of a transformer tank, shunts, windings 14, 24, press beams 15, 25, tap-changer 17.

As used herein, the term "electrical connection" broadly encompasses electrically conducting connections such as electrical leads, which may be cables or bus bars. An electrical connection may be a contiguous component formed of a conductor. Separate electrical connections may be different contiguous components that are not conductively connected together.

Virtual connections may be defined, as will be explained in more detail herein, which can represent portions of several electrical leads, i.e., which can represent a group of portions of conductive contiguous components. The virtual connections are merely an entity that is used during the determination of the layout, but which are resolved in the actual manufacturing process and/or in the actual, physical electric component when manufactured in the real world.

When the techniques disclosed herein are applied to a transformer 10, 20, the cleats 12, 22 and electrical connections 11, 21 may be defined as internal electrical circuit configuration of the transformer 10, 20. Internal connections between different components of the transformers 10, 20 (e.g., from winding 14, 24 to winding 14, 24 or between winding 14, 24 and tap-changer 17 and bushing 16, 23, 26) can be realized by the electrical connections 11, 21.

To keep the electrical connections 11, 21 in the right position (e.g., so as to ensure proper electrical and thermal distances) during service, a framework 12, 22 (ribs, leads supports) is necessary. This framework 12, 22 in general is also referred to as the cleats.

While conventional design techniques start with a user-defined framework 12, 22, the techniques disclosed herein do not require information on a user-defined framework 12, 22, but can first perform routing of electrical connections and conflict management. The resulting conflict-free three-dimensional routes of the electrical connections can be used to automatically determine, based on the conflict-free three-dimensional routes of the electrical connections, the three-dimensional geometry of the framework 12, 22.

The automatic design method may use user inputs that define fixed points, such as the locations of winding-exits 23, connectors on bushings 16, 23, 26, connectors on tap-changers 17 that serve as start and end points of internal electrical connections of the electric component.

The automatic design method may use user inputs that define geometric constraints, such as information on the arrangement and size of walls of a transformer tank, shunts, windings 14, 24, press beams 15, 25, and/or a tap-changer 17.

Generally, the methods and systems allow the three-dimensional routing of the electrical connections 11, 21 to be automatically determined. Determining the three-dimensional routing of the electrical connections 11, 21 comprises an optimization routine for path search, which may take into account thermal, electrical and/or mechanical constraints. Conflict management is performed to ensure that the three-dimensional routing of different electrical connections 11, 21 does not interfere with each other.

The methods and systems allow the design process to be performed such that a routing of the electrical connections 11, 21 is generated first and the layout of the framework 21, 22 can be determined subsequently. The search for the routing of the electrical connections 11, 21 is automated. The optimal path between start and end point is found, while respecting geometrical constraints, such as minimal distances to boundaries (e.g. tank, windings, and other leads). The route search may be performed as an optimization problem that considers electrical, thermal, manufacturing and cost requirements.

Various effects and advantages are attained by the methods and systems according to the invention. A number of man hours required for determining the three-dimensional layout can be reduced by simplifying the complexity for the human engineer. Material savings can be attained, because a cost reduction of each connection can be tracked. Material losses can be reduced due to material saving. Pre-manufacturing and the overall manufacturing process may be simplified by grouping electrical connections so as to ensure that groups of electrical connections are routed jointly, where possible. In this way, highways of electrical connections can be formed that extend through part of the electric component.

As will be explained in more detail below, co-routing (or joint routing) of portions of electrical connections may be automatically performed where possible, which further reduced manufacturing costs. Various techniques can be used to encourage the joint routing of portions of electrical connections, as will be explained with reference to FIGS. 8 to 16. A "virtual" connection can be defined which represents portions of electrical connections that are routed jointly so as to extend in parallel and adjacent to each other, while still respecting the constraints imposed by the path optimization problem.

Figure 3:
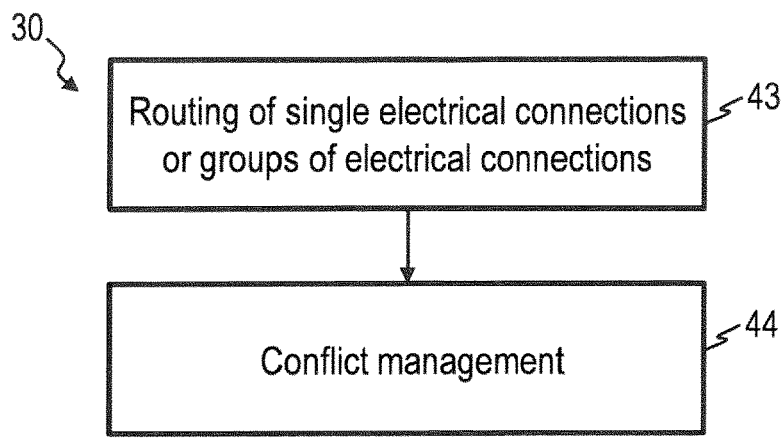
FIG. 3 is a flow chart of a method according to an embodiment.

FIG. 3 is a flow chart of a method 30 according to an embodiment. The method 30 comprises route search step 43 and a conflict management step 44.

The route search step 43 may be performed to determine three-dimensional routes of single electrical connections or groups of electrical connections.

A route may be determined to be optimum in the sense of the route search at step 43 if the route minimizes an objective function. The minimization of the objective function may take into account not only the costs associated with an individual route, but also the global costs and constraints associated with all routes. As used herein, the term costs should not be understood to refer to financial costs only. Rather, the term costs as used herein refers to penalties that are imposed for routes that are financially costly, that require prohibitively large amounts of material, and/or that do not comply with geometrical, mechanical, electrical, or thermal constraints.

For illustration, the route search at step 43 may be performed so as to find a least cost path which minimizes an objective function of the following form:

$$C(j)=C_0(j)+C_1(j)+C_2(j)+C_3(j) \quad (1)$$

The label j indicates the route for the $j^{th}$ electrical connection, which may be single lead or a group of leads (i.e., a virtual lead representing a group of physical leads). The function $C_0$ may represent the financial costs and/or material costs associated with the route. The function $C_0$ may depend on the overall length of the route, the overall amount of material required for the route, and/or the number of bends along the route.

The function $C_1$ may represent thermal constraints. Thermal modeling may be performed to determine the thermal constraints. The thermal modeling may depend on, e.g., a type and geometry of an insulating material, thermal characteristics, such as heat absorption and thermal conductivity, of an insulating material, or other parameters which may be specified by a user input. The function $C_1$ may represent the thermal constraints converted into geometrical constraints. For illustration, in order to avoid excessive heating of parts formed of plastic or of tank walls of a transformer, the thermal constraints may be imposed in such a way that an electrical connection needs to have a certain minimum distance from the tank wall or from plastic parts.

The function $C_2$ may represent mechanical constraints. Mechanical modeling may be performed to determine the mechanical constraints. The mechanical constraints may depend on, e.g., material characteristics of press beams or other fixed components of the electric component. The function $C_2$ may represent the mechanically constraints converted into geometrical constraints. For illustration, in order to avoid excessive loads or moments on press beams or other parts of a transformer, the mechanical constraints may be imposed in such a way that only a certain amount of material may respectively be supported on a fix component and/or that torque arms remain smaller than a distance threshold.

The function $C_3$ may represent electrical constraints. Modeling may be performed to determine the electrical constraints. The electrical constraints may depend on, e.g., the amplitudes of currents that are expected to be passed through the respective electrical connection. The function $C_3$ may represent the electrically constraints converted into geometrical constraints. For illustration, in order to avoid excessive capacitive or inductive crosstalk, the electrically constraints may be imposed in such a way that a must be a minimum distance between different electrical connections.

Route optimization may, but does not need to be performed individually for each electrical connection. For illustration, the accrued optimization may be performed in such a way that a global objective function $$C=\Sigma_j C(j) \quad (2)$$

is minimized.

The route search may be performed on a grid or on a hierarchy of grids, as will be explained in more detail below.

The conflict management at step 44 may use heuristics. For illustration, heuristics similar to simulated annealing or tabu search may be used. Alternatively or additionally, mathematical optimization may be used to generate three-dimensional routes which are conflict-free. The mathematical optimization may comprise mixed integer programming or any other relevant technology including dynamic programming or constraint programming or genetic algorithms.

Various modifications of the objective function may be used. For illustration, the objective function may have the following form:

$$C(j)=C_0(j)+C_1(j)+C_2(j)+C_3(j)+C_4(j) \quad (1')$$

where $C_4(j)$ encourages a portion of the $j^{th}$ electrical connection to be routed jointly with portions of other electrical connections for which routing has previously been performed.

Alternatively or additionally, the global cost function may have the following form:

$$C=\Sigma_j C(j)+C_{co} \qquad (2')$$

where $C_{co}$ encourages portions of electrical connections to be routed jointly with portions of other electrical connections.

Alternatively or additionally, the path optimization routine may use a heuristic which guides the search. The preference for co-routing parts of electrical connections jointly, i.e., combining them into a virtual connection, can be integrated into the heuristic.

The conflict management may be performed in various ways, as will be explained in more detail with reference to FIGS. 5 and 6.

The methods and systems according to embodiments solve the problem of determining the three-dimensional layout of an electric component, such as a power transformer or another power component, by transforming this problem into a sequence of nested mathematical optimization tasks. These optimization tasks include the routing step 43 and the conflict management step 44. The single optimization steps 43, 44 may be highly tailored towards the specific properties of the electric power component for which the three-dimensional layout is to be determined.

The routing of single electrical connections or leads (such as cables, bundles of cables, or bus bars) may be based on optimum path search algorithms, such as A* or Dijkstra methods, or any other relevant technique including dynamic programming, mathematical programming to solve the optimum path problem or the constrained optimum path problem.

Many conventional optimum path algorithms, such as A* or Dijkstra methods, are uni-directional. Since the routing problem for electrical connections allows optimality of the solution to be balanced with computation speed, a bi-directional optimum path algorithm (such as bi-directional A*) can be used, which can give quite significant speedup. The bi-directional optimum path algorithm can perform edge expansion from both ends of the path.

In order to avoid confusion, the term "optimum path" is used herein for a path that minimizes an objective function, but does not necessarily require the path to have the shortest geometrical length. For illustration, straight line connections may be highly undesirable in cases when they violate electrical, thermal, or mechanical constraints.

Thus, a "shortest" or optimum path in the sense of this application is not necessarily one that minimizes the geometrical distance in dependence on the constraints. Rather, the objective function for the respective path, as exemplarily described in connection with formula (1) or (1') above, or the global objective function associated with all paths, as exemplarily described in connection with formula (2) or (2') above, is to be minimized. Taking into account not only the length of the path, but also thermal, electrical, and mechanical constraints provides significantly improved results for the electric component that is designed.

The underlying graph used in the optimum path search may consist of a rectangular gridding of the 3D space. The gridding may be augmented by direction. Optionally, the gridding may be augmented by an orientation, if applicable, such as for bus bars and bundles of cables.

The gridding can be homogenous or non-homogenous. The gridding can be hierarchical. For illustration, the gridding can be coarse at high level, and can then be refined at lower levels, where the solution process will work in an iterative manner from coarse- to fine-grained levels to speed up the computation.

The neighborhood exploration, which is present in many optimum route search such as A* and Dijkstra algorithms, may take into account all the electrical, thermal, and mechanical constraints and preferences, preferably translated into geometric constraints. This avoids the need for modeling after each iteration of the route search. For illustration, minimum distances may be defined so that electrical, thermal, and mechanical constraints are respected. The minimum distances may comprise minimum distances between leads and other objects. The objective function may comprise the cost of bends, and/or may reflect a cost reduction for co-routing, as has been explained in association with equations (1) and (2) or equations (1') and (2') above.

When a route search algorithm is used that requires an estimation function in the expansion step, as is the case for the Dijkstra algorithm, the estimation function that represents the remaining costs from the expansion step to the end point of the respective route can be estimated based on, e.g., geometrical distance, possibly augmented with heuristic information.

In any one of the embodiments disclosed herein, groups of leads can be routed jointly. In order to keep a group of leads together, a single virtual lead is defined and is then routed. The single virtual lead represents a group of at least two electrical connections. Co-routing may reduce the overall costs associated with the manufacturing process. Several virtual leads may be defined, each of which represents a group comprising at least two electrical connections.

Figure 4:
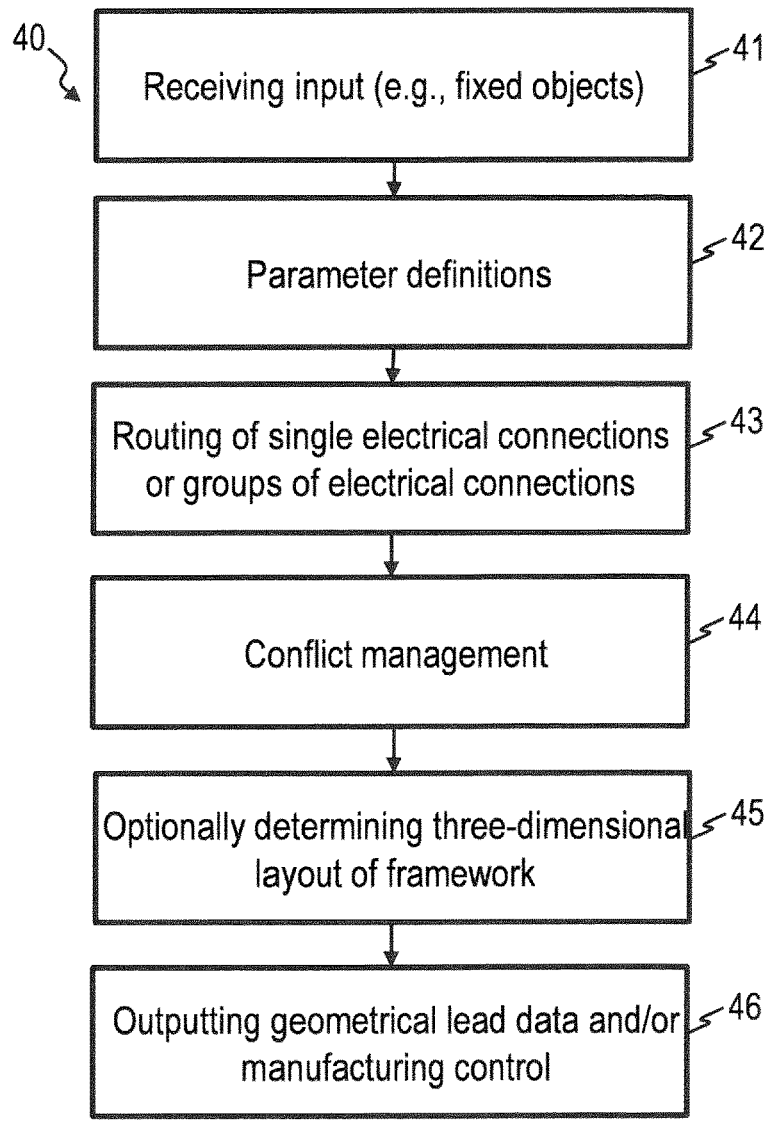
FIG. 4 is a flow chart of a method according to an embodiment.

FIG. 4 is a flow chart of a method 40 according to an embodiment.

At step 41, an input is received. The input may be provided by a human engineer or may alternatively be read from a machine-readable description of fixed parts, material choices, or other specifics of the electric component for which the three-dimensional layout of internal electrical connections is to be determined. The input may comprise a representation of fixed objects, which may be given as a CAD file. The input may alternatively or additionally comprise a parameter definition that may comprise costs, penalties, grids, constraints, and settings for optimization. Alternatively, the parameter definition may be retrieved from a database at step 42. This applies in particular to parameters for the search routines and conflict management, which may be retrieved from a database that includes expert knowledge.

Subsequently, routing of individual electrical connections or groups of electrical connections and conflict management is performed at steps 43 and 44.

At step 45, a three-dimensional geometry of a support framework for the electrical connections may optionally be determined after the conflict-free routes of the electrical connections have been determined.

At step 46, the determined conflict-free three-dimensional routes of the electrical connections may be output. Alternatively or additionally, the determined conflict-free three-dimensional routes may be used for controlling a manufacturing tool, such as a bending or other forming tool that produces the electrical connections. If the three-dimensional geometry of the support framework is also determined, parts or the entire support framework may also be manufactured automatically based on the geometry determined at step 45.

Conflict management can generally be based on heuristics and/or mathematical optimization to generate conflict-free three-dimensional routes. To exemplary techniques for implementing the conflict management will be described with reference to FIGS. 5 and 6.

One technique of performing conflict management involves moving from feasible sub-optimal to feasible (close-to) optimal three-dimensional routes. The term feasible refers to conflict-free routes. Routes can be added one after another. Each new route can take into account the previously planned routes for of the electrical connections. The solution is feasible by construction. The second step involves relaxing some electrical connections, e.g. by performing a neighborhood exploration, to find a better solution.

Figure 5:
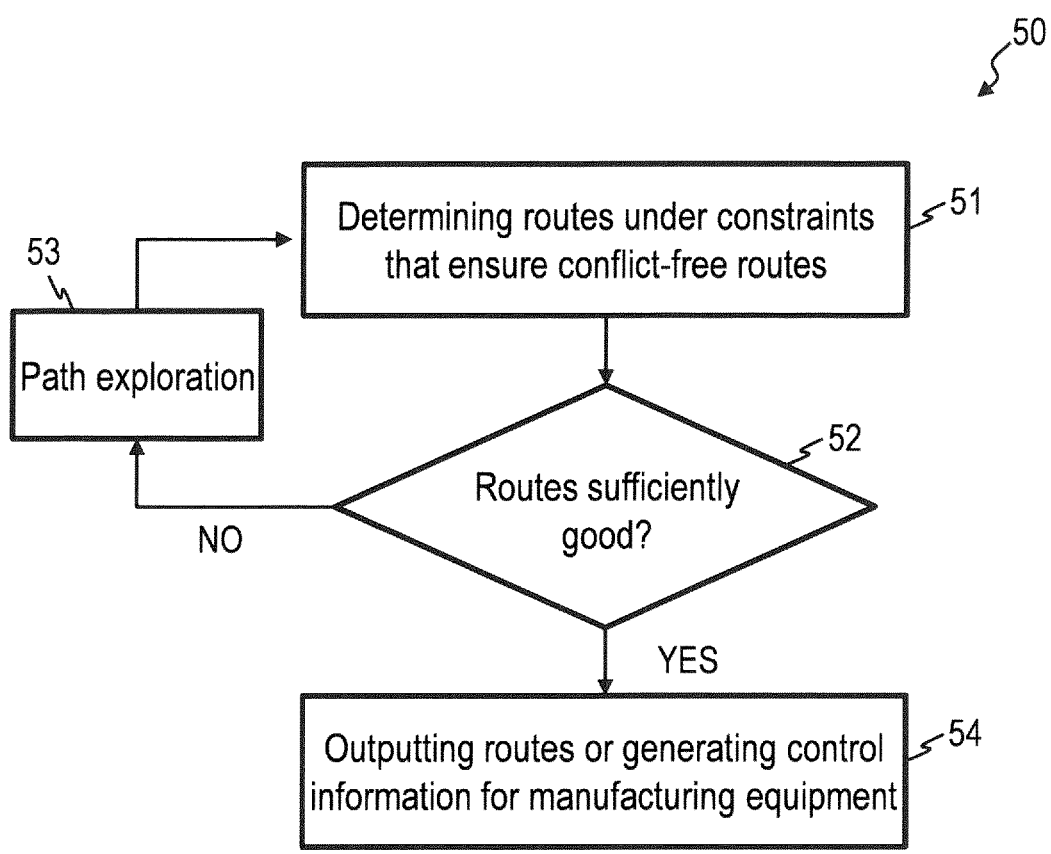
FIG. 5 is a flow chart of a method according to an embodiment.

FIG. 5 is a flow chart of a method 50 in which a set of routes is first constructed so as to be conflict-free by construction and path exploration is subsequently performed to optimize the set of routes.

At step 51, routes are determined so as to ensure that the routes are conflict-free. The routes can be determined one after another, respectively ensuring that there are no conflicts with any previously determined route.

At step 52, it can be determined whether the routes are sufficiently good. They determination may be performed based on the objective function, as explained with reference to equations (1) and (2) above.

If the routes are not sufficiently good, at step 53 a path exploration may be performed. In the path exploration, some electrical connections such as bus bars or leads are relaxed to further optimize the objective function. "Relaxing" here can mean a local exploration around the solutions that have been initially found at step 51. Relaxing can involve local alterations of the previously found routes.

If the routes are found to be sufficiently good, e.g. based on a convergence criterion for the objective function, the routes may be output at step 54. Alternatively or additionally, they conflict-free optimum routes may be used to generate control commands for manufacturing equipment.

In another implementation, conflict management may be performed by moving from infeasible super-optimal to feasible (close-to) optimal three-dimensional routes. Routes are planned independently from one another at first, thereby creating conflicting three-dimensional routes for the electrical connections. Penalties may be imposed on the conflicting parts of the three-dimensional routes in order to ensure convergence to a conflict-free solution.

A procedure as generally explained with reference to FIG. 5 can be repeated in various rounds. In each round, all the electrical and virtual connections may be sequentially routed, such that each newly routed connection does not have any conflict with any of the previously routed connections. However, if conflicts absolutely cannot be avoided, they are tolerated at a penalty, in the hope that such conflicts can be resolved later.

After all electrical connections and virtual connections have been routed, re-routing can be performed around the previously found solutions with the aim of resolving any remaining conflicts, until no improvement can be achieved.

Since this is a local optimization method, it can be applied several times (i.e., in several rounds), with different starting conditions. The starting conditions can be different from each other in (a) the order in which the electrical connections or virtual connections are routed in the round and/or (b) the initial estimate solution for each of the electrical or virtual connections.

For each of the electrical or virtual connections, the initial solution can be taken from the previous round. A guess based on expert knowledge or a simple straight line solution can be used as starting solution in the first round. By exploring alterations around the previously found solutions, the routes are "relaxed" within the meaning of this application. The more electrical or virtual connections are relaxed, the more space can be given to the connections that are routed first in the round, so they may achieve lower cost solutions, at the expense of the other connections.

Figure 6:
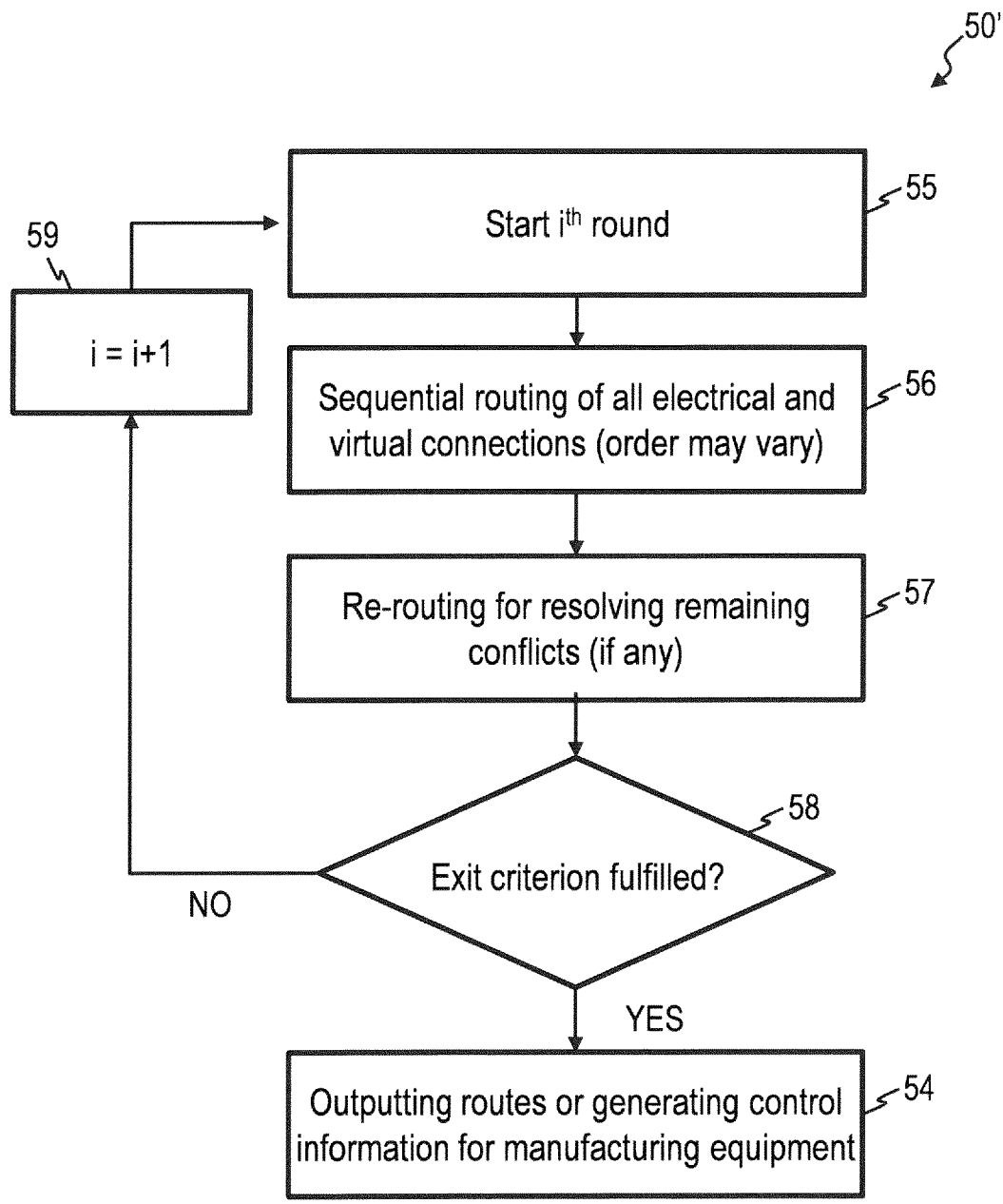
FIG. 6 is a flow chart of a method according to an embodiment.

FIG. 6 is a flow chart of a method 50' in which the construction of conflict-free routes and optimization is performed in several rounds.

At step 55, the $i^{th}$ round is started. The index i may be 1 in the first iteration.

At step 56, all electrical and virtual connections are sequentially routed. The routing may respectively be performed such that the routed connection does not have any conflicts with any previously routed connection. The order in which connections are routed will depend on the round i that is being performed.

At step 57, re-routing may be performed for resolving conflicts if there are any conflicts in the routes found at step 56.

At step 58, it is determined whether an exit criterion is fulfilled. If the exit criterion is not fulfilled, the method may continue with the next round at steps 59 and 55.

If the exit criterion is fulfilled, the method may continue with outputting the routes may at step 54. Alternatively or additionally, the conflict-free optimum routes may be used to generate control commands for manufacturing equipment.

Figure 7:
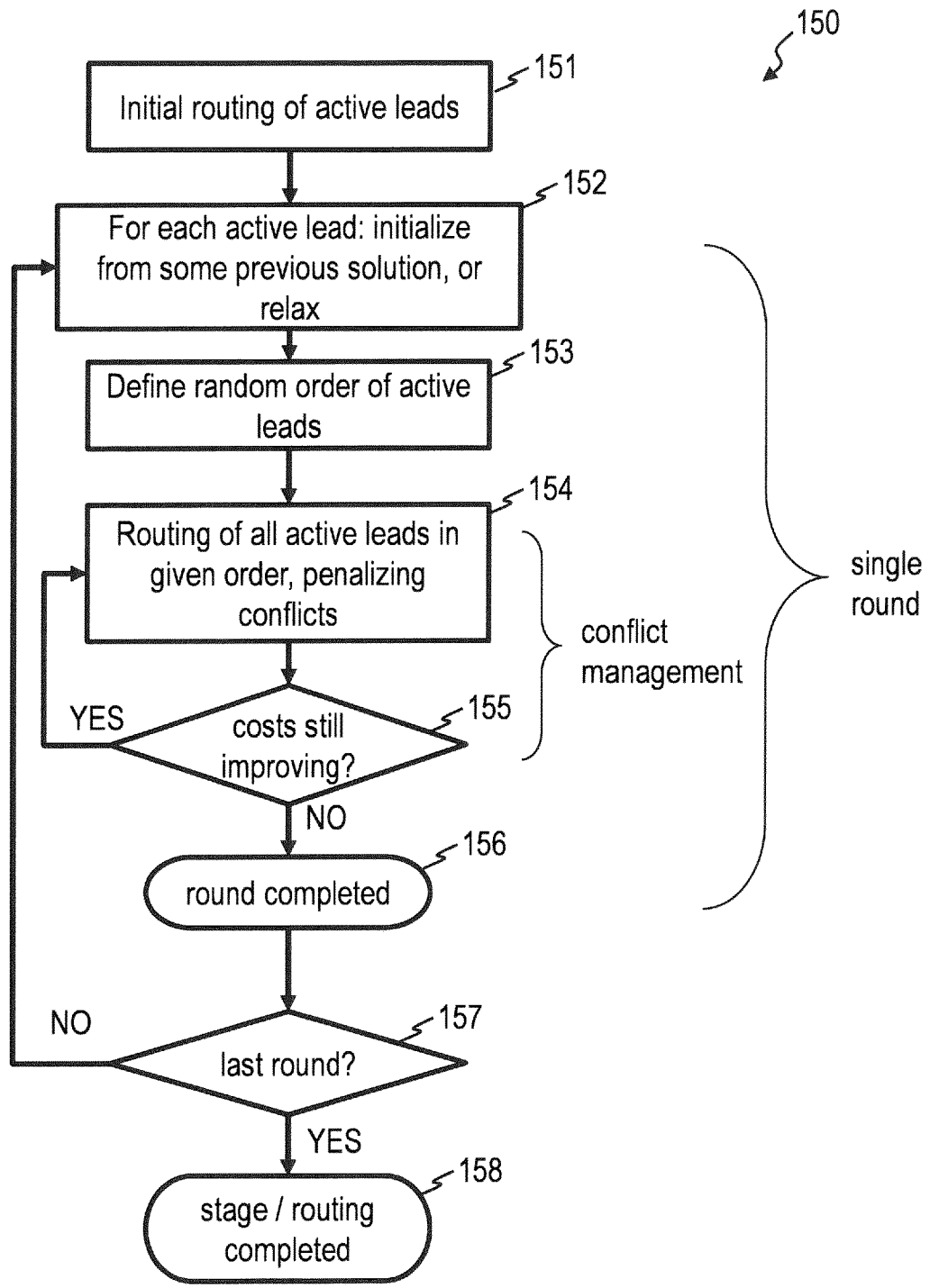
FIG. 7 is a flow chart of a method according to an embodiment.

FIG. 7 is a flow chart of a method 150 in which the construction of conflict-free routes and optimization is performed in several rounds. In FIG. 7, an "active lead" is an electrical connection for which routing is performed in the respective round. The set of active leads may vary from one round to another. Even the number of active leads may vary.

At step 151, initial routing of a set of active leads is started. The set of active leads may depend on the round that is being performed.

At step 152, an initialization or relaxation may be performed for each active lead. The initialization may be based on a previous solution or may be an initial guess based on, e.g., expert knowledge. Relaxing may be performed by varying around a previously found solution.

At step 153, a random order of the active leads may be defined. The random order may depend on the round.

At step 154, the active leads may be routed sequentially in the order determined at step 153. The routing may respectively be performed such that the routed connection does not have any conflicts with any previously routed connection. If conflicts absolutely cannot be avoided at step 154, the conflict(s) is/are being tolerated at step 154, but a penalty is imposed on such conflicting solutions. The penalty can be an additional term in the objective function of equations (1), (1'), (2), or (2'), for example.

At step 155, it is determined whether costs (i.e., the value of the objective function that is to be minimized) are still improved by the conflict management. If the costs are still improved, the method may return to step 154.

At step 156, the respective round is completed.

At step 157, it is determined whether the round was the last round. If not, the method may return to step 152.

At step 158, the routing is completed. The conflict-free optimum routes may be output. Alternatively or additionally, the conflict-free optimum routes may be used to generate control commands for manufacturing equipment.

Figure 8:
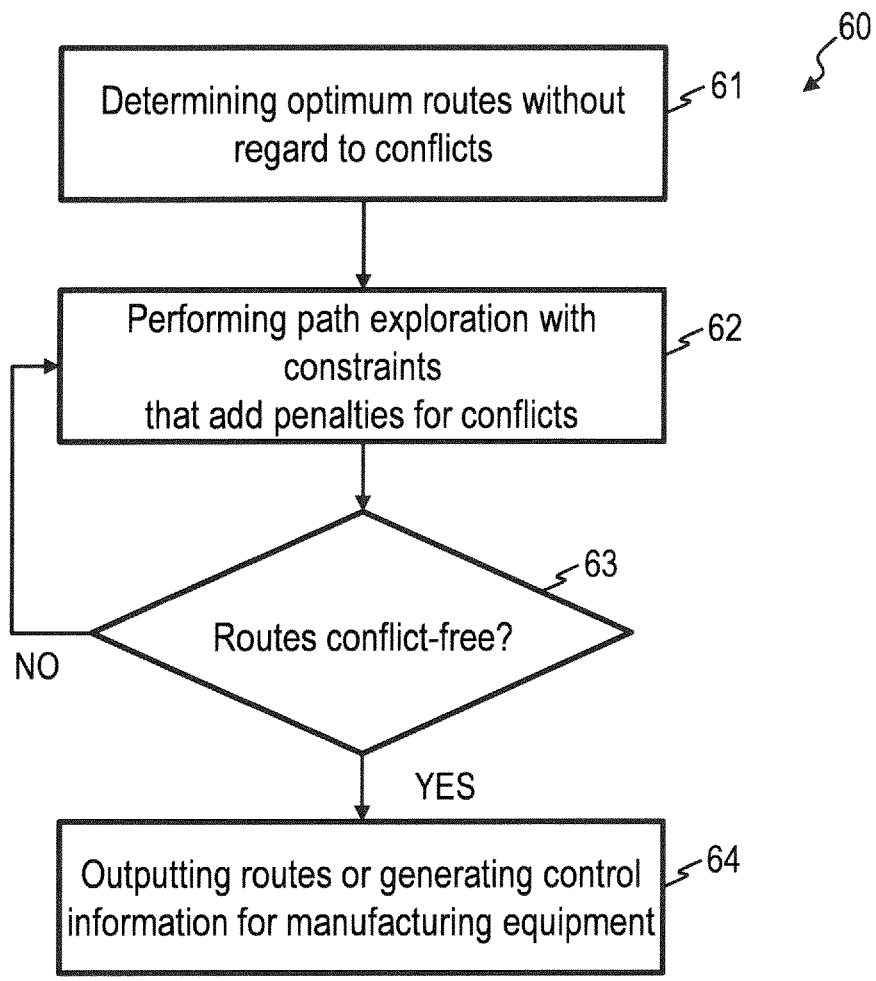
FIG. 8 is a flow chart of a method according to an embodiment.

FIG. 8 is a flow chart of a method 60 in which a set of routes is first constructed such that the routes can have conflicts, and conflicting routes are eliminated subsequently.

At step 61, three-dimensional routes may be determined without considering possible conflicts. For illustration, the objective function of equation (1) may be minimized individually for each electrical connection. In this process, it can be assumed that there are no conflicts in the cost terms $C_1$, $C_2$, and $C_3$ that are caused by any other electrical connection that is to be routed. Note that the cost terms $C_1$, $C_2$, and $C_3$ may still take into consideration potential penalties that are caused by thermal, mechanical, or electrical considerations when considering the fixed parts of the layout, such as a housing of the electric component, a winding of the electric component, or press beams of the electric component.

At step 62, a path exploration may be performed with constraints that create penalties for any conflicts. That path exploration may be a neighborhood exploration around the routes that have been found at step 61.

At step 63, it is determined whether the routes are conflict-free. If the routes are not conflict-free, the method may return to step 62.

At step 64, if a set of conflict-free routes has been found, the routes may be output. Alternatively or additionally, the conflict-free optimum routes may be used to generate control commands for manufacturing equipment.

Various additional processing steps may be provided in the methods according to embodiments. For illustration, automatic control may be performed for manufacturing equipment that is used to manufacture the electrical connections of the electric component, such as a power transformer, and/or for further manufacturing equipment that is used to manufacture the framework for the electrical connections. The system that automatically performs the route optimization and conflict management may have an interface that is adapted to provide CAD data to the manufacturing machines or to control computers that perform the required conversion of the CAD data into control commands.

The method may include a pre-processing step. In the pre-processing, a base model with a definition of terminals may be generated, e.g. using a 3D CAD system. The base model may define fixed points of the electric component. The pre-processing may comprise receiving information on dimensions of cables, busbars, or other leads. The pre-processing may comprise receiving information that is based on thermal calculations. The pre-processing may comprise receiving a user input that assigns different terminals as start and end points of an individual electrical connection.

The method may use a geometric representation of the fixed objects as an input. The geometric representation may be given as a CAD file. The method may use parameter definitions as a further input. They parameter definitions may comprise information on costs, penalties, grids, constraints, and settings for optimization. For illustration, coefficients of the objective function defined in equation (1) or (1') may be specified by a user input or may be retrieved from a database.

Conflict-free three-dimensional routes may be determined using any one of the techniques described above. Different parameterization may be used in this process. For illustration, the optimization may start with individual leads without conflict management and may add conflict management in a second step.

The method may provide geometrical data that are obtained by the optimization process. This data may be imported into a 3D CAD module. The conflict-free three-dimensional routes may be output via a user interface. Alternatively or additionally, the conflict-free three-dimensional routes may be used to automatically generate control commands for manufacturing equipment.

The method according to an embodiment may be implemented as a software tool for automatic or semi-automatic routing of electrical connections. The software or other computer executable instruction code can run on a local machine or in the cloud, or can be executed as distributed code between local machines and cloud.

The design tool for determining the three-dimensional layout of internal connections of an electric component can be embedded in a larger optimization framework, where an outer level explores different options of the electrical, thermal, and/or mechanical design, and the inner level optimizes the routing for the specific option explored. Thereby, a set of candidate solutions can be generated and presented to an engineer.

The design tool for determining the three-dimensional layout may be configured to provide multiple solutions representing various different objective functions.

In addition to determining conflict-free three-dimensional routes of electrical connections, the design of the supporting structure, such as cleats, may be automatically semi-automatically determined.

In any one of the methods disclosed herein, the routing may be performed so as to encourage portions of two or more electrical connections to be routed together, i.e., adjacent each other and parallel to each other, along at least parts of their lengths. The constraints may still be respected by this co-routing.

Figure 10:
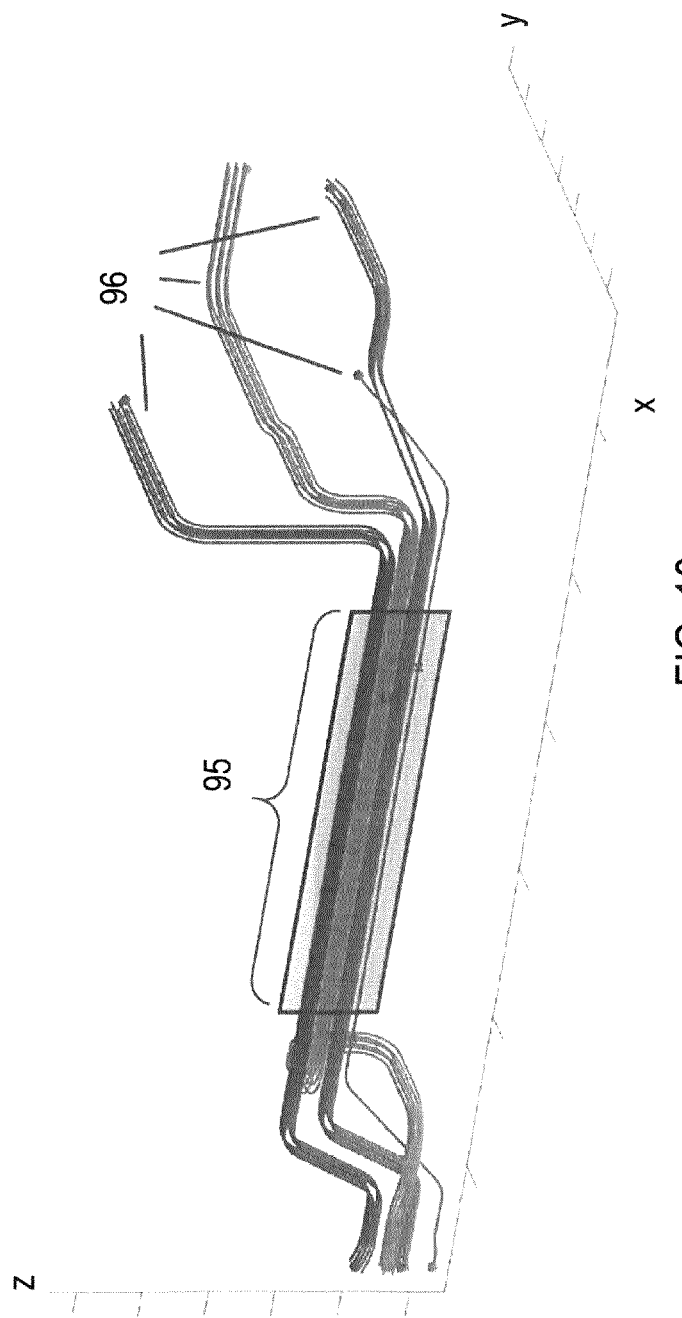
FIG. 10 is a diagram for illustrating aspects of the method of FIG. 9.

As typically only portions of electrical connections can be routed together, electrical connections can be divided up first into different portions or segments, then input to the path optimization and conflict management procedures, and then the different portions or segments can be re-joined. More specifically, two or more electrical connections that should be grouped, i.e., for which portions of the two or more electrical connections are to be routed together, can each be divided up into a portion that is routed jointly with portions of other electrical connections and further portions that do not need to be routed together. FIG. 10 illustrates central portions 95 of several electrical connections, with the central portions 95 being routed jointly, and further portions 96 (e.g., end portions 96) that do not need to be routed jointly.

A virtual connection can be defined that represents the central portions 95. The virtual connection is an abstract (as opposed to real-world) object that represents portions of several physical electrical connections (i.e., real-world connections, when the design is used for manufacturing the electric component). While only one virtual connection is illustrated in FIG. 9, more than one virtual connection can be defined.

The virtual connection(s) and the end portions 96 (or further portions of the electrical connections that do not need to be routed together) can be routed either sequentially, as will be explained with reference to FIG. 9, or at the same time.

Figure 9:
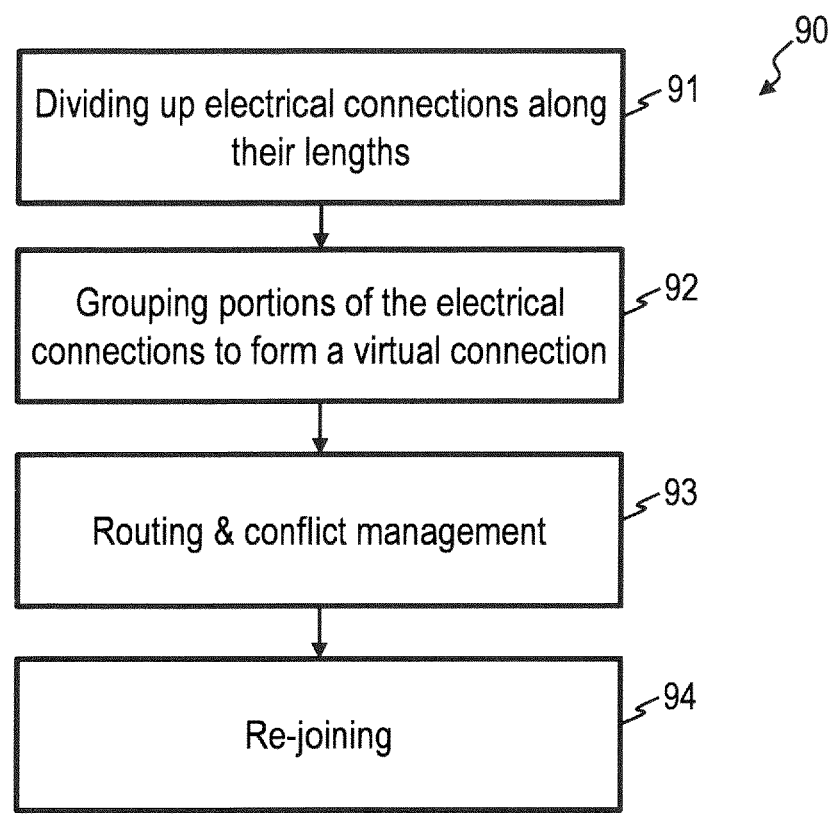
FIG. 9 is a flow chart of a method according to an embodiment.

FIG. 9 is a flow chart of a method 90. The method 90 may be combined with the routing techniques explained with reference to FIGS. 1 to 8.

At step 91, electrical connections are divided up along their lengths. The electrical connections are divided up into a portion 95 that is to be routed jointly with a corresponding portion 95 of other electrical connections, so that the portions 95 extend parallel and in proximity to each other. The remaining further portions 96 of the electrical connections do not need to be routed jointly with parts other electrical connections.

Different techniques can be used for determining which part(s) of electrical connections are to be routed jointly with parts of other electrical connections, as will be explained with reference to FIG. 14 and as has already been explained above in association with the objective functions of equations (1') and (2').

At step 92, a virtual connection may be defined which represents the portions 95 of two or more electrical connections that are grouped together.

At step 93, routing and conflict management is performed. This may be done in various ways. In one implementation, virtual connection(s) and the portions 96 that do not need to be routed jointly may be routed separately. The virtual connection(s) may be routed first, and the portions 96 that do not need to be routed jointly may be routed in a second, subsequent processing step.

Routing may respectively include execution of the path optimization routine (e.g., first for the virtual connection(s) 95 and then subsequently for the further portions 96) and subsequent conflict management. Alternatively, if the virtual terminals of the virtual connection(s) 95 are known by way of approximation, the virtual connection(s) 95 and the end portions 96 may be routed concurrently, as will be explained with reference to FIG. 11.

At step 94, the portions 96 that do not need to be routed jointly with other electrical connections may be joined to the virtual connection 95, to thereby revert to a representation of a physical electrical connection that combines or joins the co-routed portion 95 and the further portion(s) 96.

Figure 11:
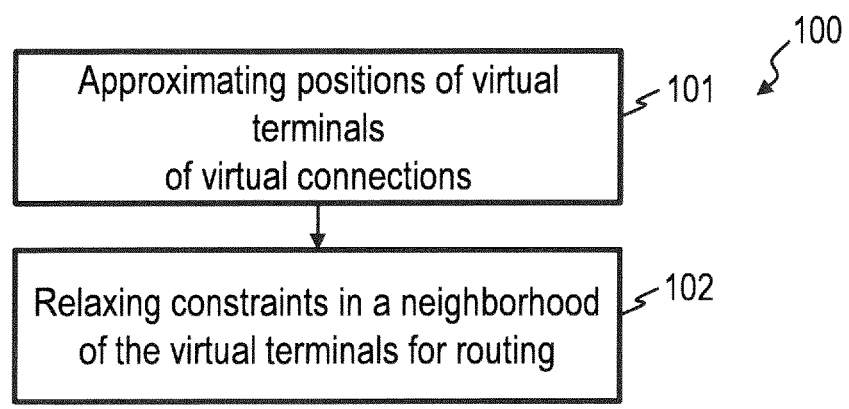
FIG. 11 is a flow chart of a method according to an embodiment.
Figure 12:
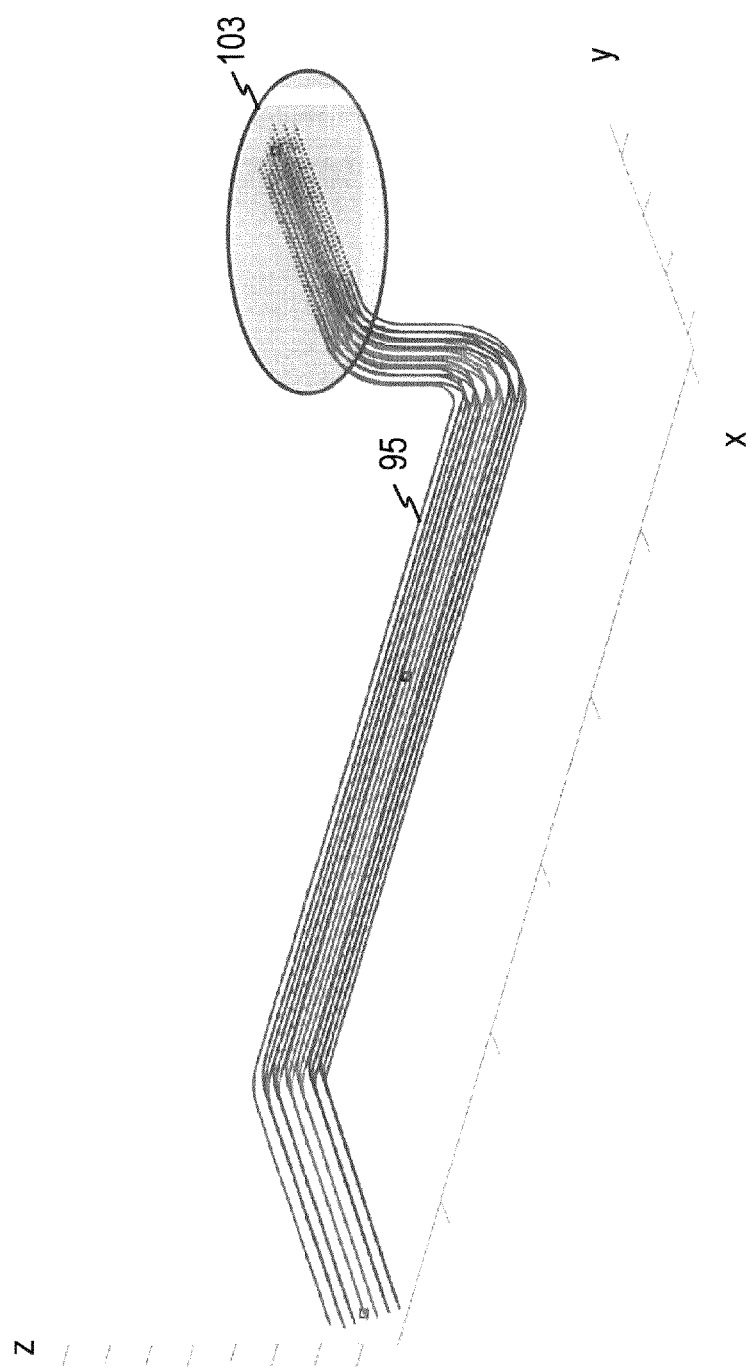
FIG. 12 is a diagram for illustrating aspects of the method of FIG. 11.

FIG. 11 is a flow chart of a method 100. The method 100 may be combined with the routing techniques explained with reference to FIGS. 1 to 10. The method 100 allows one or several virtual connection(s) 95 and end portions 96 of the electrical connections to be routed at the same time.

At step 101, positions of terminals or end points of the virtual connection may be determined by using an approximation. The positions of terminals or end points of the virtual connection can be computed by invoking an averaging technique for the terminal positions of the constituent portions 95 of two or more electrical connections that are to be grouped. For illustration, the center of gravity of the terminals or end points of the constituent portions 95 of the virtual connection may be calculated. These terminals of the virtual connection are virtual terminals in the sense that they typically do not correspond to any physical end point or terminal of a routed electrical connection in the real world, when the design is used for manufacturing an electric component.

At step 102, routing is performed. In a neighborhood 103 of the virtual terminal (shown in FIG. 12), the routed virtual connection 95 may violate constraints. For illustration, in the neighborhood 103, the routed virtual connection 95 may pass through a solid object. This violation of a constraint may subsequently be cured in conflict management, e.g., at step 57 in FIG. 6 or at step 154 in FIG. 7 or at step 93 in FIG. 9.

The neighborhood 103 of the virtual terminal in which constraints are relaxed may have a predefined size. The neighborhood 103 of the virtual terminal in which constraints are relaxed may have a size that depends on a characteristic dimension of the electric component, e.g., on a transformer tank size.

Figure 13:
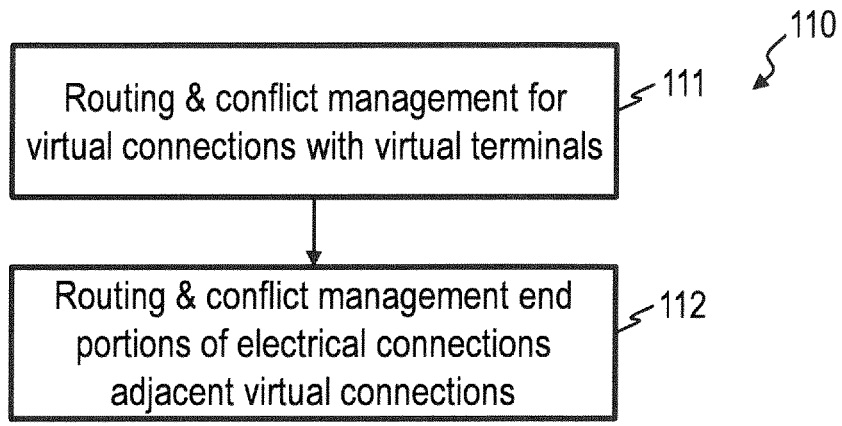
FIG. 13 is a flow chart of a method according to an embodiment.

FIG. 13 is a flow chart of a method 110. The method 110 may be combined with the routing techniques explained with reference to FIGS. 1 to 11. The method 110 allows one or several virtual connection(s) 95 and portions 96 of electrical connections that are not to be co-routed with other electrical connections to be determined sequentially.

At step 111, routing and conflict management may be performed for one or several virtual connection(s) 95. The positions of terminals or end points of the virtual connection can be computed by invoking an averaging technique for the positions of the portions 95 of electrical connections that are grouped together. For illustration, the center of gravity of the terminals or end points of the constituent portions 95 of the virtual connection may be calculated. These are virtual terminals in the sense that they typically do not correspond to any physical end point or terminal position of a routed electrical connection in the real world when the electric component is manufactured. Routing and conflict management can be performed using any one of the techniques described herein.

At step 112, routing and conflict management may be performed for the portions 96 of the electrical connections. This can be done in such a way that a constraint prohibits the portions 96 from entering into the determined route for the virtual connection 95.

Co-routing portions 95 of electrical connections together is attractive, e.g., because it may save costs. Therefore, the techniques disclosed herein may be implemented in such a way that they encourage co-routing. This may be done in various ways.

In one implementation, co-routing of the portions 95 of electrical connections can be encouraged by means of the objective function, as has been explained with reference to equations (1') and (2') above. Efficient optimum path algorithms, such as algorithms based on A*, are based on a heuristic that guides the search and speeds up the optimization. It is possible to include co-routing criteria into that heuristic.

In another implementation, when two electrical connections have a "common" point (i.e., if the two electrical connections are located in close proximity, while still being spaced so as to respect the constraints imposed by the optimum path problem) and a common direction at that point, co-routing may be explored. Co-routing is achieved automatically wherever it is expedient. For instance, for the end portions 96 coming out of the co-routed portions 95, co-routing will automatically be achieved at least in part, since the end portions 96 start together at the end points of the virtual connection 95, having a common initial direction.

Thus, while the decision on which electrical connections are to be co-routed in a virtual connection can be made based on a user input, for example, the co-routing may automatically be encouraged for as long as the electrical connections have a common direction at a position at which they are proximate to each other.

Figure 14:
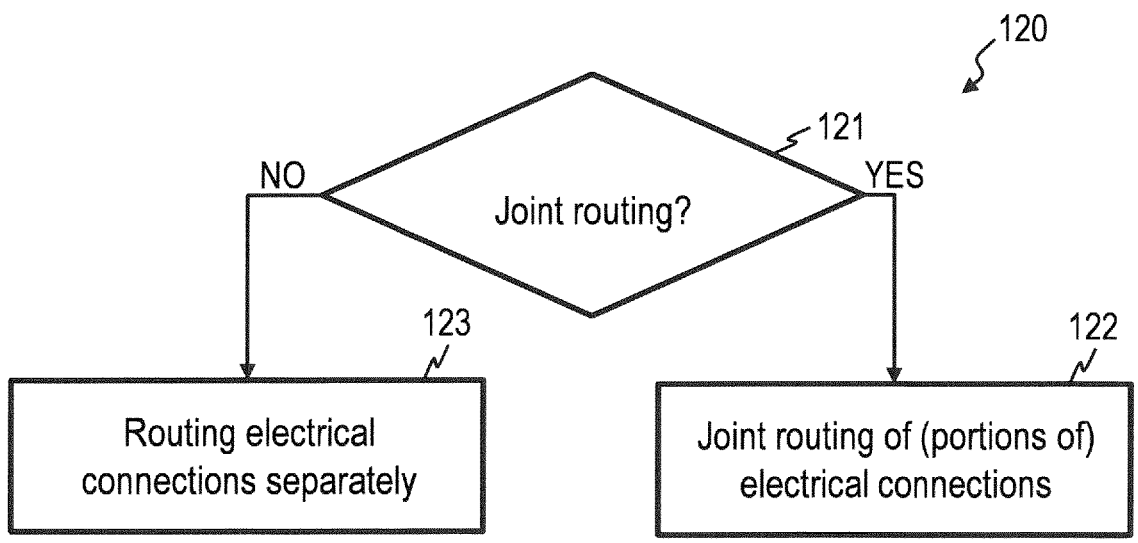
FIG. 14 is a flow chart of a method according to an embodiment.

FIG. 14 is a flow chart of a method 120. The method 120 may be used in combination with the methods of any one of FIGS. 1 to 13. At step 121, it is determined whether joint routing of two or more electrical connections is to be performed. The determination at step 121 may be based on a user input. If two or more electrical connections are grouped together, e.g., by a user input, the two or more electrical connections may initially be routed together (step 122). Co-routing may be continued for as long as the two or more electrical connections have a "common" point (i.e., if the two electrical connections are located in close proximity while still respecting the constraints imposed by the optimum path problem) and a common direction at that point. If the two or more electrical connections are not to be grouped together, the two or more electrical connections may be routed separately (step 123). The determination step 121 does not need to be performed based on a user input.

The path optimization routine may include a uni-directional or bi-directional optimum path search. For the co-routing described with reference to FIG. 14, a uni-directional optimum path search (e.g., uni-directional A*) may be suitable. If a bi-directional optimum path search (e.g., bi-directional A*) is used to speed up the computation, it can have a modified termination criterion that ensures that portions 95 of electrical connections are co-routed where possible.

The co-routing concepts described above may be implemented not only for bundling individual electrical connections such that portions of the electrical connections co-extend in the identified routes, but can also be applied to bundle virtual connections into other (higher hierarchy) virtual connections.

For illustration, bundles of electrical connections or bundles of virtual connections can be formed by just letting them start at a "common" starting point (where "common" starting point means that the two electrical or virtual connections have starting points which are very close but still comply with their mutual constraints). Bundles of virtual connections may be formed. Thereby, the concept of bundling or grouping is applied on a further hierarchy level.

Figure 16:
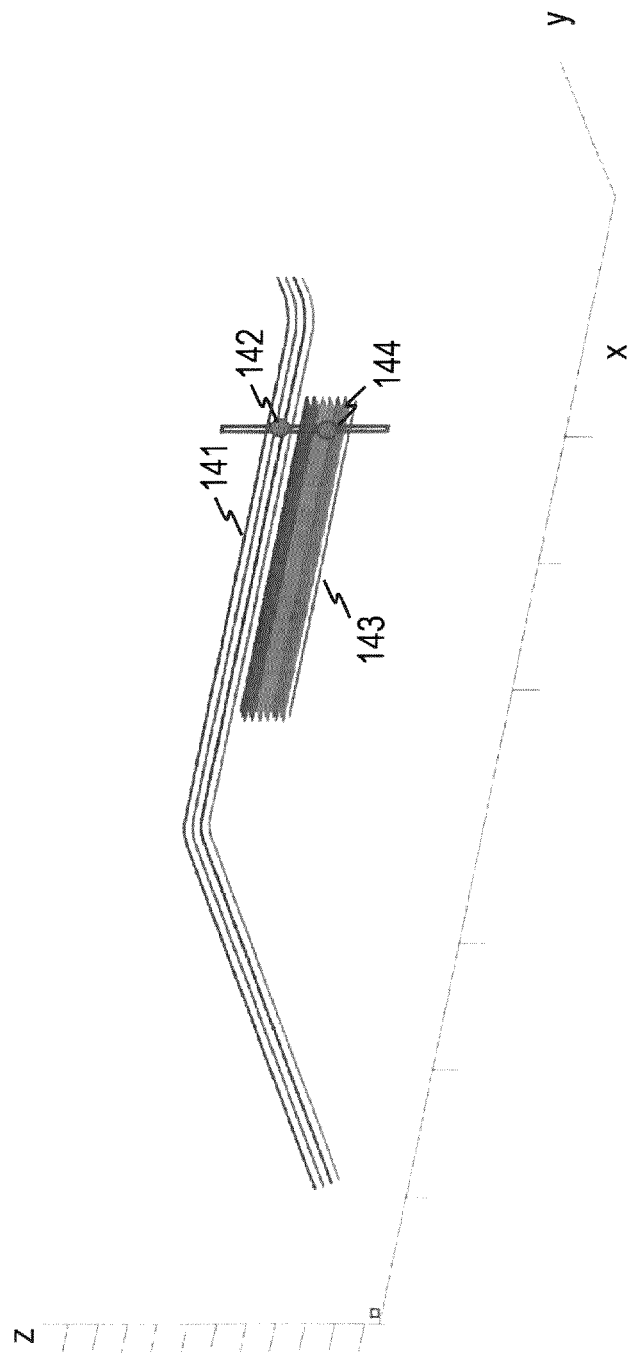
FIG. 16 is a diagram for illustrating aspects of the method of FIG. 15.

FIG. 16 shows an example where a first virtual connection 141 (in which portions of a first group of electrical connections are co-routed) and a second virtual connection 143 (in which portions of a second group of electrical connections are co-routed) are grouped together so as to co-extend, i.e., run in parallel and adjacent each other. This can be achieved by having the first virtual connection 141 and the second virtual connection 143 start at end or terminal points 142, 144 that are "common" in the sense that they are close to each other, while respecting any mutual constraints that may be imposed by the path optimization problem.

Thus, grouping connections so that portions thereof co-extend may be applied hierarchically. Electrical connections (e.g., individual leads or busbars) may be bundled or grouped in such a manner that they include co-routed portions that are combined to form a virtual connection 95 in the route search. Virtual connections 141, 143 may be bundled or grouped in such a manner that they include co-routed portions that are combined to form a second hierarchy level virtual connection.

Grouping can either be achieved by routing a virtual connection or by defining a bundling point 142, 144 and taking advantage of the fact that the path optimization routine tends to co-route portions of electrical connections or of virtual connections that have close starting points and similar starting directions.

Figure 15:
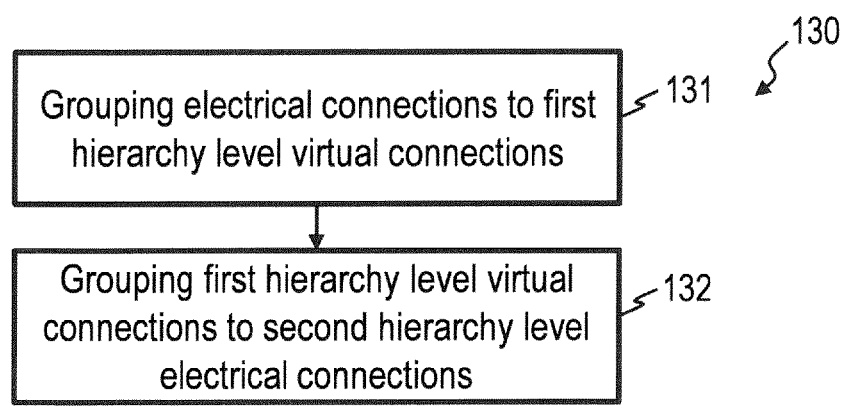
FIG. 15 is a flow chart of a method according to an embodiment.

FIG. 15 is a flow chart of a method 130. The method 130 may be used in combination with the methods of any one of FIGS. 1 to 14. At step 131, electrical connections may be grouped or bundled to form first hierarchy level virtual connections. This may be done by letting portions 95 of the electrical connections start at closely located starting points that still respect the constraints of the optimization problem, and with a common direction.

At step 132, first hierarchy level virtual connections 141, 143 may be grouped or bundled to form second hierarchy level virtual connections. This may be done by letting portions first hierarchy level virtual connections 141, 143 start at closely located starting points 142, 144 that still respect the constraints of the optimization problem, and with a common direction.

Figure 17:
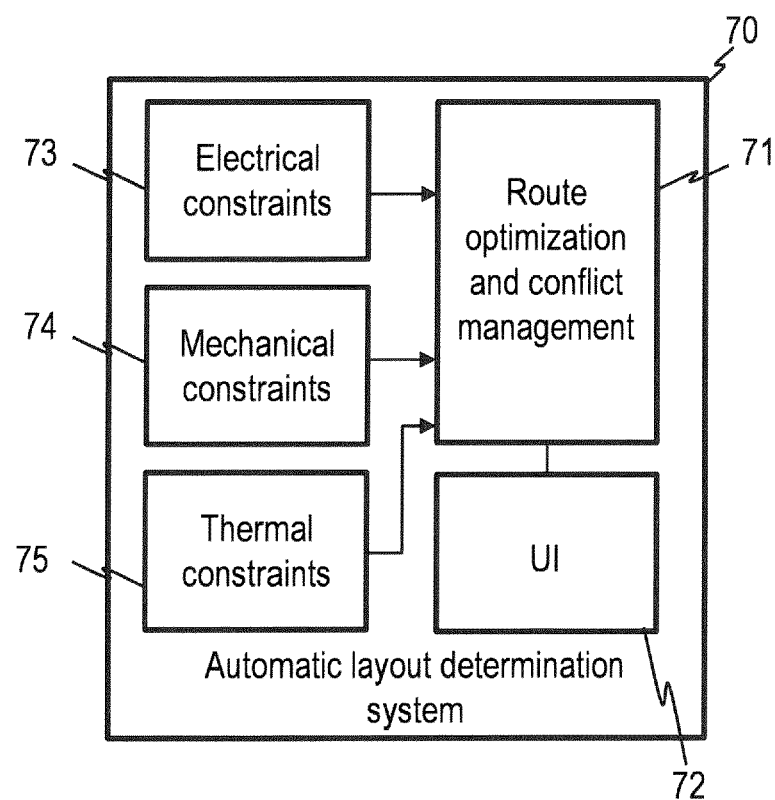
FIG. 17 is a block diagram of a system according to an embodiment.
Figure 18:
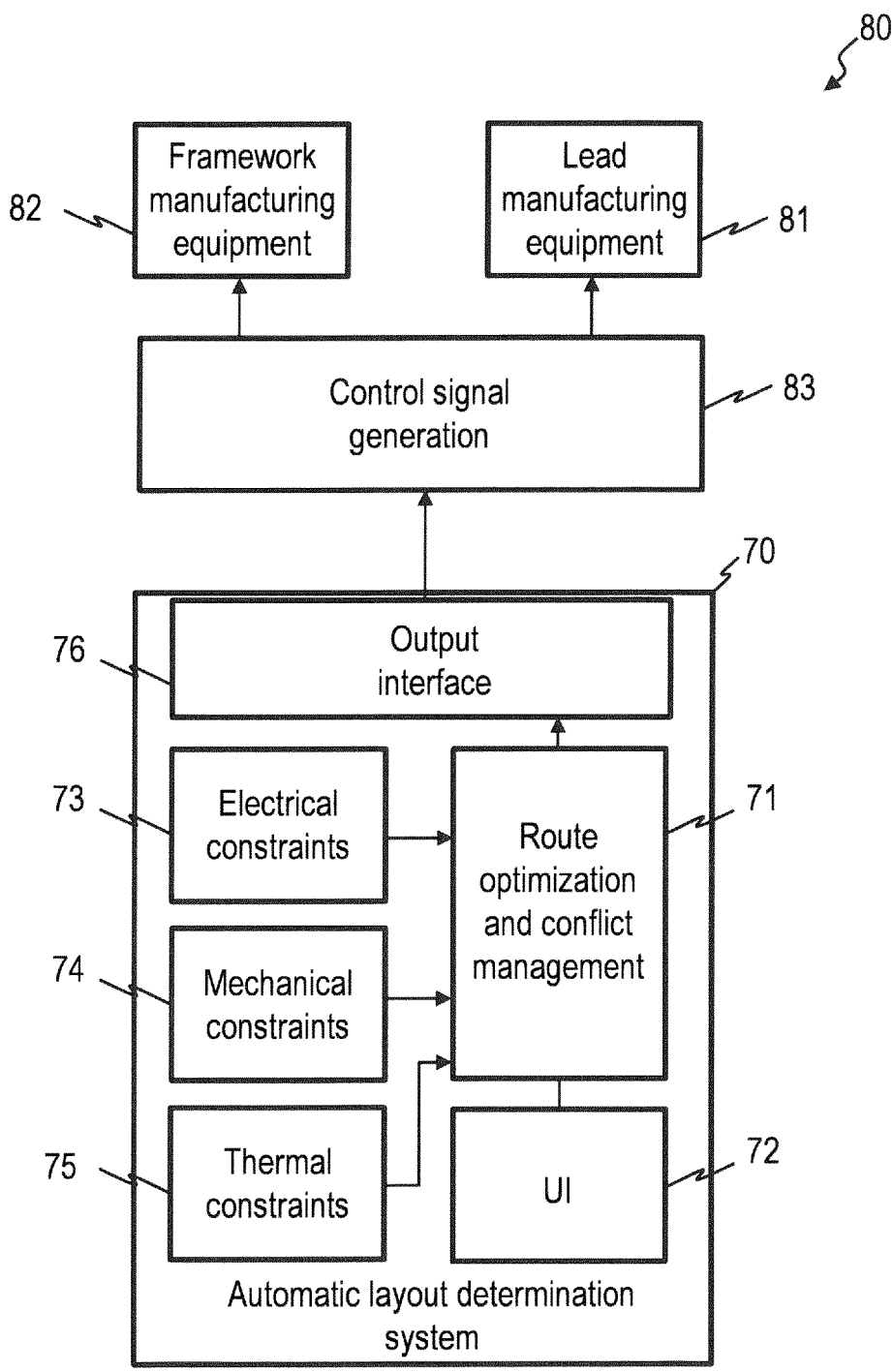
FIG. 18 is a block diagram of a system according to an embodiment.

FIGS. 17 and 18 are representations of systems 70, 80 that can be used to automatically or semi-automatically determine the three-dimensional layout of at least some internal electrical connections of an electric component. A system 70 may be implemented as a computer, a server connected to a local terminal via a wide area network, or as a distributed computing system.

The system 70 comprises a processor or a set of processes 71 that is adapted to perform route optimization and conflict management to determine conflict-free three-dimensional routes for electrical connections.

Various modules 73, 74, 75 may convert electrical, mechanical and thermal constraints or other constraints into geometrical constraints. The modules 73, 74, 75 may perform modeling or may use data from a data basis to convert electrical, mechanical and thermal constraints into geometrical constraints.

The system 70 may comprise a user interface 72. At the user interface 72, information on the electric component for which the three-dimensional layout is to be determined may be received. Information on the determined conflict-free three-dimensional routes may be output via the user interface 72.

As shown in FIG. 18, the system 70 may have an output interface 76. Information on the determined conflict-free three-dimensional routes may be output via the output interface 76. When the system 70 is adapted to determine the three-dimensional layout of the framework supporting the electrical connections along the determined conflict-free three-dimensional routes, information on the three-dimensional layout of the framework may be output via the output interface 76.

A control signal generation circuit 83 may be integrated into the system 70 or may be provided separately therefrom. The control signal generation circuit 83 may generate control signals for lead manufacturing equipment 81 and/or framework manufacturing equipment 82. For illustration, the lead manufacturing equipment 81 may comprise a bending tool, a cutting tool, a stamping tool, or other tools for forming electrical connections that are to be installed in the electrical component, such as a power transformer. Based on the determined conflict-free three-dimensional data, the lead manufacturing equipment 81 may be controlled. For illustration, many bending machines are CNC machines that receive numeric inputs. The outputs files of the system 70 can be post-processed, e.g. by the control signal generation circuit 83, for controlling a manufacturing process.

The framework manufacturing equipment 82 may comprise a 3D rapid-prototyping equipment that may be used to produce cleats (i.e., insulated mechanical fixing parts). The outputs files of the system 70 can be post-processed, e.g. by the control signal generation circuit 83, for controlling a manufacturing process.

Embodiments of the invention may be used for determining the three-dimensional layout of leads or other electrical connections in transformers, power converters, semi-conductors, inductors, capacitors, batteries, circuit breakers, power resistors, transducers, in particular for use in medium or high power networks or for use in medium or high power generation. Methods according to the invention may be used in association with a power system component, e.g., a power generation or power transmission system, without being limited thereto.

While the invention has been described in detail in the drawings and foregoing description, such description is to be considered illustrative or exemplary and not restrictive. Variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. The mere fact that certain elements or steps are recited in distinct claims does not indicate that a combination of these elements or steps cannot be used to advantage, specifically, in addition to the actual claim dependency, any further meaningful claim combination shall be considered disclosed.

The invention claimed is:

1. A method of determining a three-dimensional layout of electrical connection components of an electric component comprising a power network component, the method comprising:

executing, by at least one processor, a path optimization routine to determine three-dimensional routes for assembly of a plurality of electrical connections for the electrical connection components, the path optimization routine comprising an A* or Dijkstra algorithm, a bi-directional optimum path search routine, dynamic programming or mathematical programming;

performing, by the at least one processor, a conflict management to generate conflict-free three-dimensional routes for the plurality of electrical connections in which the electrical connections do not interfere with each other;

determining, by the at least one processor, a three-dimensional layout of the electrical connections of the electric component based on the conflict-free three-dimensional routes; and automatically determining, by the at least one processor, a three-dimensional layout of framework structures for the plurality of electrical connection components based on the conflict-free three-dimensional routes.

2. The method of claim 1, wherein at least one of the path optimization routine and the conflict management takes into account one or several of thermal constraints, mechanical constraints, and electrical constraints.

3. The method of claim 1, further comprising:

defining a virtual connection that represents a group of at least two of the plurality of electrical connections or portions of at least two of the plurality of electrical connections, wherein the path optimization routine and conflict management are performed for the virtual connection to ensure that the group is jointly routed.

4. The method of claim 3, wherein the path optimization routine and conflict management are first performed for connections that include at least one virtual connection, and wherein subsequently routing and conflict management are performed for end portions of the at least two electrical connections grouped together in the at least one virtual connection.

5. The method of claim 3, wherein the virtual connection represents only portions of the at least two of the plurality of electrical connections and the at least two of the plurality of electrical connections further comprise further portions, wherein the virtual connection and the further portions are routed separately.

6. The method of claim 3, wherein the path optimization routine has an objective function that encourages the group of at least two of the plurality of electrical connections or portions of at least two of the plurality of electrical connections to be jointly routed in the virtual connection.

7. The method of claim 1, wherein performing the conflict management comprises:

executing the path optimization routine so that that the three-dimensional routes are conflict-free, but not optimum routes, and modifying one or several of the three-dimensional routes when performing a path exploration to move from conflict-free first three-dimensional routes to conflict-free second three-dimensional routes.

8. The method of claim 1, wherein the path optimization routine is performed for the plurality of electrical connections, the path optimization routine for one of the electrical connections being performed independently from the path optimization routine for another one of the electrical connections; and wherein the conflict management comprises a conflict resolution in which cost penalties are computationally imposed for conflicting three-dimensional routes to ensure convergence towards conflict-free three-dimensional routes.

9. The method of claim 1, wherein the path optimization routine comprises an exploration step.

10. The method of claim 1, wherein the path optimization routine is performed on at least one grid.

11. The method of claim 1, further comprising:

processing the determined three-dimensional layout of the electrical connections to generate control commands for a manufacturing equipment used to manufacture the electrical connections.

12. The method of claim 1, further comprising:

processing the determined three-dimensional layout of the framework structures to generate further control commands for a further manufacturing equipment used to manufacture the framework structures.

13. The method of claim 1, wherein the electric component is selected from a group consisting of a transformer, a power converter, a semiconductor, an inductor, a capacitor, a battery, a circuit breaker, a power resistors, a transducer.

14. Computer-readable instruction code comprising instructions which, when executed by at least one processor of a computing device, cause the processor to perform the method according to claim 1.

15. The method of claim 3, wherein the path optimization routine uses a heuristic that encourages the group of at least two of the plurality of electrical connections or portions of at least two of the plurality of electrical connections to be routed as the virtual connection.

16. The method of claim 3, further comprising determining a virtual terminal of the virtual connection, wherein at least one constraint is locally relaxed in a neighborhood of the virtual terminal when executing the path optimization routine and conflict management for the virtual connection.

17. The method of claim 1, wherein the plurality of connection components comprises a plurality of electrical cables.

18. The method of claim 17, further comprising:

assembling a plurality of framework structures according to the three-dimensional layout;

connecting the plurality of electrical cables according to the conflict-free three-dimensional routes to assemble the plurality of electrical connections.

19. A system comprising at least one integrated semiconductor circuit programmed to:
- execute a path optimization routine to determine three-dimensional routes for a plurality of electrical connections of an electric component, the path optimization routine comprising an A* or Dijkstra algorithm, a bi-directional optimum path search routine, dynamic programming or mathematical programming, wherein the path optimization routine is performed for the plurality of electrical connections, the path optimization routine for one of the electrical connections being performed independently from the path optimization routine for another one of the electrical connections;
- perform a conflict management to generate conflict-free three-dimensional routes for the plurality of electrical connections in which the electrical connections do not interfere with each other, wherein the conflict management comprises a conflict resolution in which cost penalties are computationally imposed for conflicting three-dimensional routes to ensure convergence towards conflict-free three-dimensional routes;
- determine a three-dimensional layout of the electrical connections of the electric component based on the conflict-free three-dimensional routes; and
- automatically determine a three-dimensional layout of framework structures for the plurality of electrical connections based on the conflict-free three-dimensional routes.

20. A method of determining a three-dimensional layout of electrical connections of an electric component, the method comprising:
- executing, by at least one processor, a path optimization routine to determine three-dimensional routes for a plurality of electrical connections of the electric component, the path optimization routine comprising an A* or Dijkstra algorithm, a bi-directional optimum path search routine, dynamic programming or mathematical programming;
- performing, by the at least one processor, a conflict management to generate conflict-free three-dimensional routes for the plurality of electrical connections in which the electrical connections do not interfere with each other;
- defining a virtual connection that represents a group of at least two of the plurality of electrical connections or portions of at least two of the plurality of electrical connections, wherein the path optimization routine and conflict management are performed for the virtual connection to ensure that the group is jointly routed;
- determining a virtual terminal of the virtual connection, wherein at least one constraint is locally relaxed in a neighborhood of the virtual terminal when executing the path optimization routine and conflict management for the virtual connection;
- determining, by the at least one processor, a three-dimensional layout of the electrical connections of the electric component based on the conflict-free three-dimensional routes; and
- automatically determining, by the at least one processor, a three-dimensional layout of framework structures for the plurality of electrical connections based on the conflict-free three-dimensional routes.

* * * * *